United States Patent
Heberle

(10) Patent No.: US 6,570,895 B2
(45) Date of Patent: May 27, 2003

(54) LASER SYSTEM USING PHASE CHANGE MATERIAL FOR THERMAL CONTROL

(75) Inventor: Geoffrey O. Heberle, Chesterfield, MO (US)

(73) Assignee: Cutting Edge Optronics, Inc., St. Charles, MO (US)

( * ) Notice: Subject to any disclaimer, the term of this patent is extended or adjusted under 35 U.S.C. 154(b) by 19 days.

(21) Appl. No.: 09/973,027

(22) Filed: Oct. 9, 2001

(65) Prior Publication Data

US 2002/0018498 A1 Feb. 14, 2002

Related U.S. Application Data

(60) Division of application No. 09/270,991, filed on Mar. 17, 1999, which is a continuation-in-part of application No. 09/151,851, filed on Sep. 11, 1998.

(51) Int. Cl.[7] .................................................. H01S 3/04
(52) U.S. Cl. .............................. 372/34; 372/36; 372/98; 372/35
(58) Field of Search ............................... 372/34, 35, 36, 372/98; 62/259.2

(56) References Cited

U.S. PATENT DOCUMENTS

| | | |
|---|---|---|
| 3,683,296 A | 8/1972 | Scalise ........................ 331/94.5 |
| 4,057,101 A | 11/1977 | Ruka et al. ..................... 165/1 |
| 4,092,614 A | 5/1978 | Sakuma et al. ........... 331/94.5 P |
| 4,219,072 A | 8/1980 | Barlow, Sr. .................... 165/32 |
| 4,228,406 A | 10/1980 | Lewis et al. ............. 331/94.5 D |
| 4,233,567 A | 11/1980 | Chernoch ................. 331/94.5 P |
| 4,315,225 A | 2/1982 | Allen, Jr. et al. ............... 372/35 |
| 4,393,393 A | 7/1983 | Allen, Jr. et al. ............... 357/81 |
| 4,415,234 A | 11/1983 | Meyers ........................ 350/310 |
| 4,454,602 A | 6/1984 | Smith ........................... 372/36 |
| 4,573,067 A | 2/1986 | Tuckerman et al. ........... 357/82 |
| 4,673,030 A | 6/1987 | Basiulis ........................ 165/32 |
| 4,709,750 A | 12/1987 | White ........................... 165/10 |
| 4,852,109 A | 7/1989 | Kuchar ......................... 372/34 |
| 4,881,233 A | 11/1989 | von Arb et al. ............... 372/35 |
| 4,963,741 A | 10/1990 | McMullin ................. 250/338.3 |
| 5,005,640 A | 4/1991 | Lapinski et al. ............. 165/170 |
| 5,076,348 A | 12/1991 | Bluege ................... 165/104.17 |
| 5,105,429 A | 4/1992 | Mundinger et al. ........... 372/34 |
| 5,220,954 A | 6/1993 | Longardner et al. .......... 165/10 |
| 5,253,260 A | * 10/1993 | Palombo ....................... 372/34 |
| 5,265,113 A | 11/1993 | Halldórsson et al. ......... 372/36 |
| 5,315,154 A | 5/1994 | Elwell ........................ 257/707 |

(List continued on next page.)

FOREIGN PATENT DOCUMENTS

WO     WO 96/28846     9/1996     ......... H01L/23/427

*Primary Examiner*—Leon Scott, Jr.
(74) *Attorney, Agent, or Firm*—Jenkens & Gilchrist

(57) ABSTRACT

A passively cooled solid-state laser system for producing high-output power is set forth. The system includes an optics bench assembly containing a laser head assembly which generates a high-power laser beam. A laser medium heat sink assembly is positioned in thermal communication with the laser medium for conductively dissipating waste heat and controlling the temperature of the laser medium. A diode array heat sink assembly is positioned in thermal communication with the laser diode array assembly for conductively dissipating waste heat and controlling the temperature of the laser diode array assembly. The heat sink assemblies include heat exchangers with extending surfaces in intimate contact with phase change material. When the laser system is operating, the phase change material transitions from solid to liquid phase. This transition of the phase change material also provides a thermal buffer for laser components such that the phase change material absorbs the energy associated with fluctuations in ambient temperature before transferring it to the laser component. Also, the heat sink assembly can contain more than one type of phase change material, each having a different melting temperature.

22 Claims, 15 Drawing Sheets

U.S. PATENT DOCUMENTS

| | | |
|---|---|---|
| 5,394,427 A | 2/1995 | McMinn et al. ............... 372/70 |
| 5,520,244 A | 5/1996 | Mundinger et al. .... 165/104.33 |
| 5,734,672 A | 3/1998 | McMinn et al. ............... 372/50 |
| 5,834,840 A * | 11/1998 | Robbins et al. ............. 257/705 |
| 6,307,871 B1 * | 10/2001 | Heberle ....................... 372/34 |
| 6,351,478 B1 * | 2/2002 | Heberle ....................... 372/36 |
| 6,397,618 B1 * | 6/2002 | Chu et al. .................. 62/259.2 |
| 2002/0018498 A1 * | 2/2002 | Heberle ....................... 372/35 |

\* cited by examiner

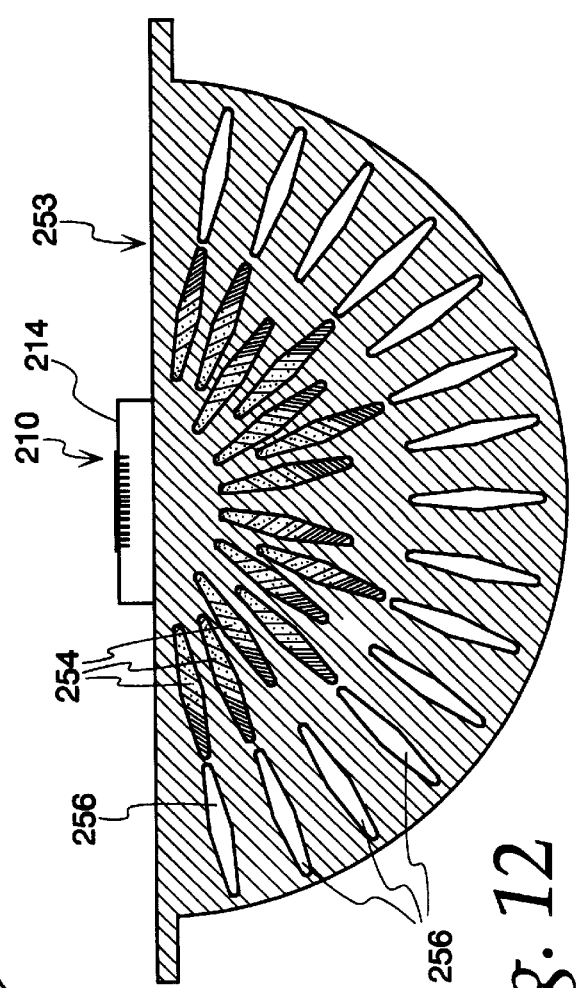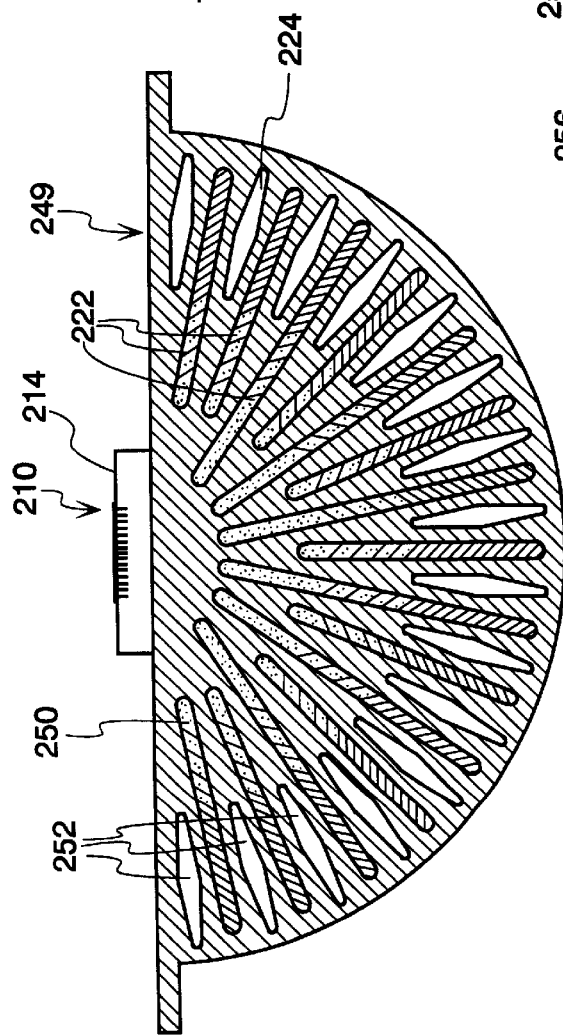

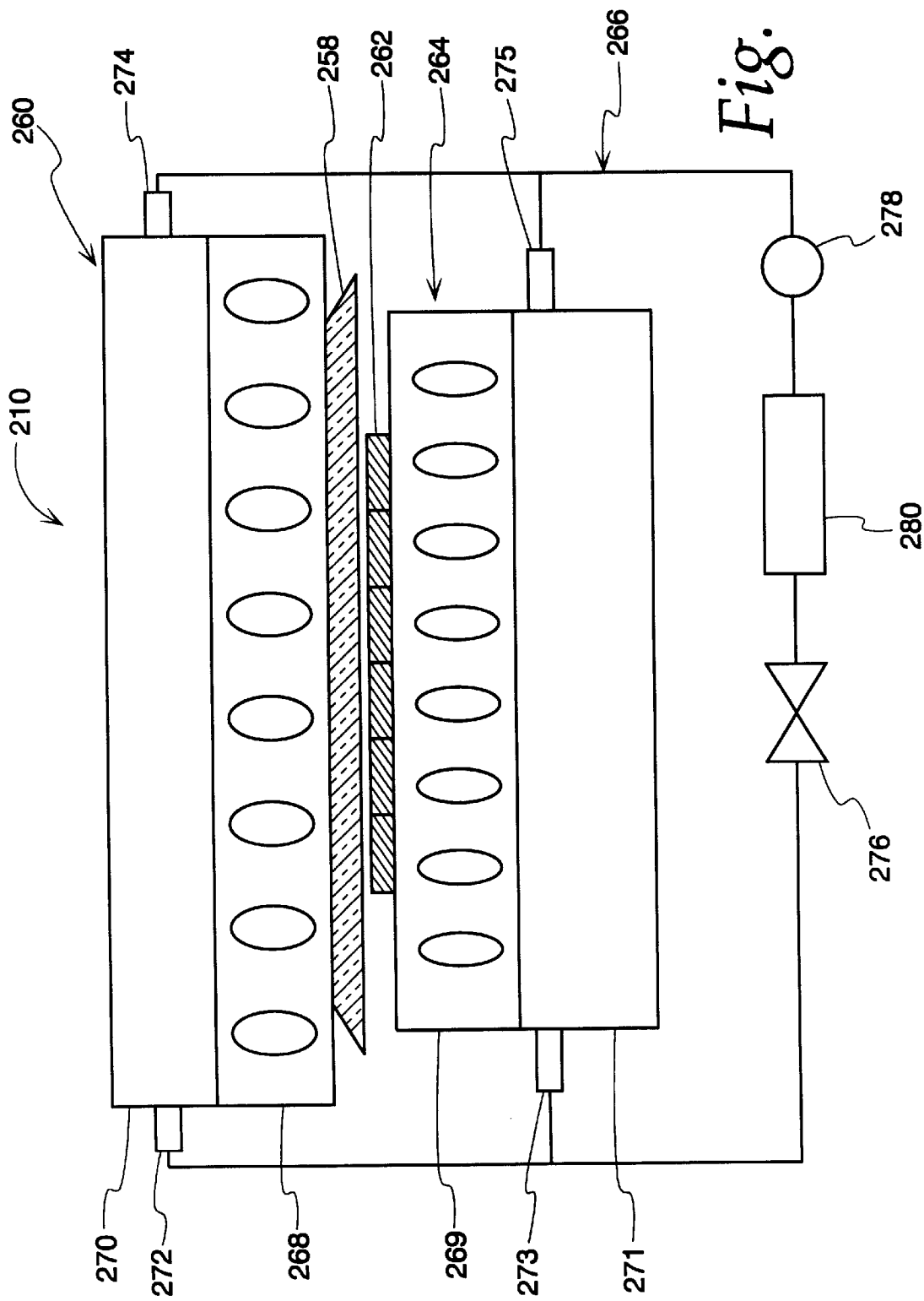

LASER SYSTEM USING PHASE CHANGE MATERIAL FOR THERMAL CONTROL

CROSS REFERENCES TO RELATED APPLICATIONS

This is a divisional of U.S. patent application Ser. No. 09/270,991, filed Mar. 17, 1999, which is a continuation-in-part of U.S. patent application Ser. No. 09/151,851, filed Sep. 11, 1998.

FIELD OF THE INVENTION

The present invention relates generally to a solid-state laser system and, in particular, to a solid-state laser that is passively cooled and thermally controlled by heat sink bodies containing phase change material.

BACKGROUND OF THE INVENTION

Solid-state laser systems are characterized in that they have a solid-state laser gain medium which converts energy from an optical pump source to a coherent output laser beam. The pump source can be one of many available energy-producing systems such as flash lamps or semiconductor laser diodes. The energy produced by the pump source is incident upon the laser medium and absorbed by the laser medium.

The absorbed energy in the laser medium causes the atoms in the laser medium to be excited and placed in a higher energy state. Once at this higher state, the laser medium releases its own energy which is placed into an oscillating state by the use of a laser resonator. The laser resonator includes at least two reflective surfaces located on either side of the laser medium. The laser resonator can be designed to continuously release a laser beam from the system. Alternatively, the resonator can be designed such that when the energy oscillating through the laser medium reaches a predetermined level, it is released from the system as a high-power, short-duration laser beam. The emitted light produced from the solid-state laser system is generally coherent and exits the system in a predefined area.

In many systems, the laser medium is Neodymium-doped, Yttrium-Aluminum Garnet (Nd:YAG). A laser medium made from Nd:YAG absorbs optical energy most readily when the energy is at a wavelength of approximately 808 nanometers (nm). Thus, the source to pump the Nd:YAG laser medium should be emitting light energy at approximately 808 nm. Gallium arsenide semiconductor laser diodes can be manufactured with dopants (e.g. aluminum) that will cause the emitted light to be in a variety of wavelengths, including 808 nm. Thus, the semiconductor laser diodes, which are lasers by themselves, act as the pump source for the laser medium.

The conversion of optical energy into coherent optical radiation is accompanied by the generation of heat which must be removed from the device. Cooling of the laser medium reduces the build-up of temperature gradients and, thereby, the strain and stress in the laser medium and also avoids the likelihood of laser medium fracture due to high thermo-elastic stress. Also, variation of the refractive index and its associated optical distortion can be largely controlled or avoided by effective cooling. The result is improved beam quality and/or increased average output power.

Diode array performance is also strongly dependent on temperature. Not only is the output power a function of temperature, but the wavelength of the emitted energy that is to be absorbed by the laser medium is also a function of diode temperature. To maintain desired array performance and to prevent the diode array from being destroyed by overheating, cooling of the area surrounding the array is also important.

Other laser assembly components, some having low damage thresholds, also require close temperature control. For example, beam dumps, that absorb and dissipate incident laser energy to ensure that incident laser energy will not emerge to interfere with wanted parts of the beam, produce heat. Nonlinear crystal assemblies for the conversion of wavelengths in a laser system utilize temperature control systems for the precise control of these temperature-sensitive crystals. Careful attention is also given to the optimal transfer of heat from acousto-optic Q-switches.

It has been an objective for laser manufacturers to develop high-power, solid-state systems. As the output power in these system increases, the waste heat increases which puts more demands on cooling systems and necessitates larger volumes in which to provide adequate cooling. Hence, the efficient and effective removal of waste heat from diode arrays, the laser medium, and other heat-generating components is an important factor in developing compact, high-powered laser systems.

Known laser systems utilize active cooling. Active cooling systems may use thermoelectric coolers, or fluid systems having mechanical pumps and coolant carrying tubing operated at pressure. However, active cooling systems consume additional power to control the temperature of the laser and require additional space in the laser system. Furthermore, active cooling requires feedback control systems to adjust the amount of cooling that is necessary to maintain the laser components at the appropriate temperature.

SUMMARY OF THE INVENTION

The present invention is a passively cooled, diode-pumped solid-state laser system producing a high-power laser beam. The system includes at least one diode array producing optical energy that is absorbed by a solid-state laser medium. The solid-state laser medium has an outer surface into which optical energy from the diode array is emitted.

The laser system further includes a pair of opposing reflective surfaces substantially optically aligned along a central axis of the laser medium and positioned with the laser medium therebetween. One of the opposing reflective surfaces is an output coupling mirror for reflecting a portion of energy produced by the laser medium to provide laser resonation and also for transmitting the high-power laser beam.

To provide the passive cooling of the laser medium, a laser medium heat sink assembly contains a substantially solid form of phase change material in thermal communication with the laser medium. The solid form of the phase change material changes to a liquid form of the phase change material in response to heat from the laser medium being transferred to the laser medium heat sink assembly.

To absorb the heat from the diode array, a diode array heat sink assembly contains a substantially solid form of phase change material in thermal communication with the diode array. The solid form of the phase change material changes to a liquid form of the phase change material in response to heat from the diode array being transferred to the diode array heat sink assembly.

While the laser system cannot be operated endlessly with only passive cooling, passive cooling can provide the necessary cooling for a laser system for several minutes. Such a system can be useful in many applications such as the terminal guidance system for a missile. Advantages to be gained from passive cooling include more compact, portable, lighter, and vibration free laser systems. Additionally, a laser system with more effective passive cooling can accommodate the increased heat transfer associated with a more powerful laser.

Furthermore, employing a phase change material in combination with the heat exchanger having a working medium flowing therethrough provides temperature control of laser components in addition to heat absorption properties. Thermal control is provided by the latent heat associated with the phase change material. A material in its solid phase will continue to absorb energy and remain at a constant temperature (its melting point) until a specified amount of energy is absorbed completing the transition from solid to liquid phase. Furthermore, an interface in intimate contact with the phase change material proceeding through this transition will be held at approximately a constant temperature until the transition from solid to liquid is complete.

To provide for more continuous operation of the laser system using a phase change material, the heat sink assembly containing phase change material is placed in thermal communication with a heat exchanger containing working fluid. The liquid form of the phase change material changes to a solid form in response to heat being transferred from the heat sink assembly to the heat exchanger. Also, the heat exchanger can be operated in reverse (i.e. transfer heat from the working fluid, or a heater, to the phase change material) to liquefy the phase change material and, thereby, maintain temperature-sensitive components at optimal operating temperatures.

The heat sink assembly containing phase change material provides a thermal buffer for laser components when the ultimate heat sink, such as the ambient air, is subject to temperature fluctuations. The thermal buffer is associated with the latent heat of fusion of the phase change material as it undergoes a phase change. The temperature of the laser component generally remains constant as the energy associated with changes in ambient temperature is absorbed in the phase change material before it is transferred to the laser component. The thermal control provided by the phase change material alleviates the need for an electronic thermal-control loop.

Additional thermal control qualities are provided by another embodiment in which a heat sink assembly containing phase change material is placed in thermal communication with a thermoelectric cooler. With the thermoelectric cooler disposed between the temperature-sensitive component and the heat sink heat is transferred from the component, across the thermoelectric cooler, and into the heat sink. With the heat sink assembly disposed between the temperature-sensitive component and the thermoelectric-cooler, the phase change material is maintained in its melt phase as heat is removed from the phase change material by the thermoelectric cooler. Also, the thermoelectric cooler can be operated to discharge heat into the heat sink assembly if it is desired to raise the temperature of any system component.

In another embodiment, the heat sink contains more than one type of phase change material, each having a different melting temperature. In this embodiment, the thermal gradient can be tailored, for example, by placing phase change material with a greater melting temperature in cavities closer to the temperature-sensitive component relative to cavities filled with a phase change material having a lower melting temperature.

BRIEF DESCRIPTION OF THE DRAWINGS

Other objects and advantages of the invention will become apparent upon reading the following detailed description and upon reference to the drawings in which:

FIG. 11 is a cross-sectional view of another embodiment showing the heat sink assembly, heat exchanger, and laser diode array;

FIG. 12 is a cross-sectional view of another embodiment showing the heat sink assembly, heat exchanger, and laser diode array;

FIG. 13 is a side view, partially schematic, illustrating the diode array and laser medium in thermal communication with two dual-stage temperature control systems;

Figure 1:
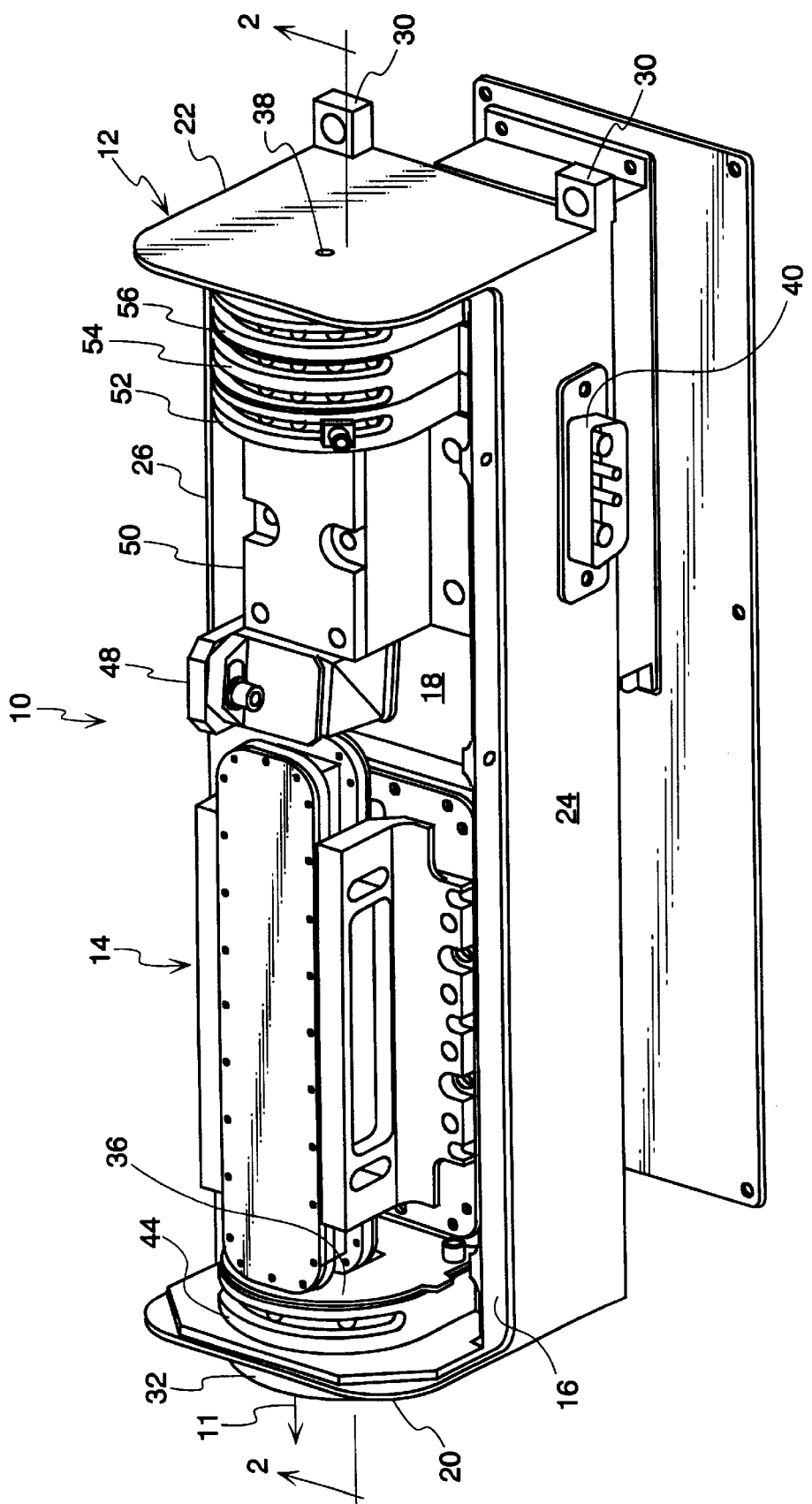
FIG. 1 is a perspective view of the solid-state laser system of the present invention.

While the invention is susceptible to various modifications and alternative forms, a specific embodiment thereof has been shown by way of example in the drawings and will herein be described in detail. It should be understood, however, that it is not intended to limit the invention to the particular forms disclosed. Quite to the contrary, the intention is to cover all modifications, equivalents, and alternatives falling within the spirit and scope of the invention as defined by the appended claims.

DETAILED DESCRIPTION OF THE INVENTION

Figure 2:
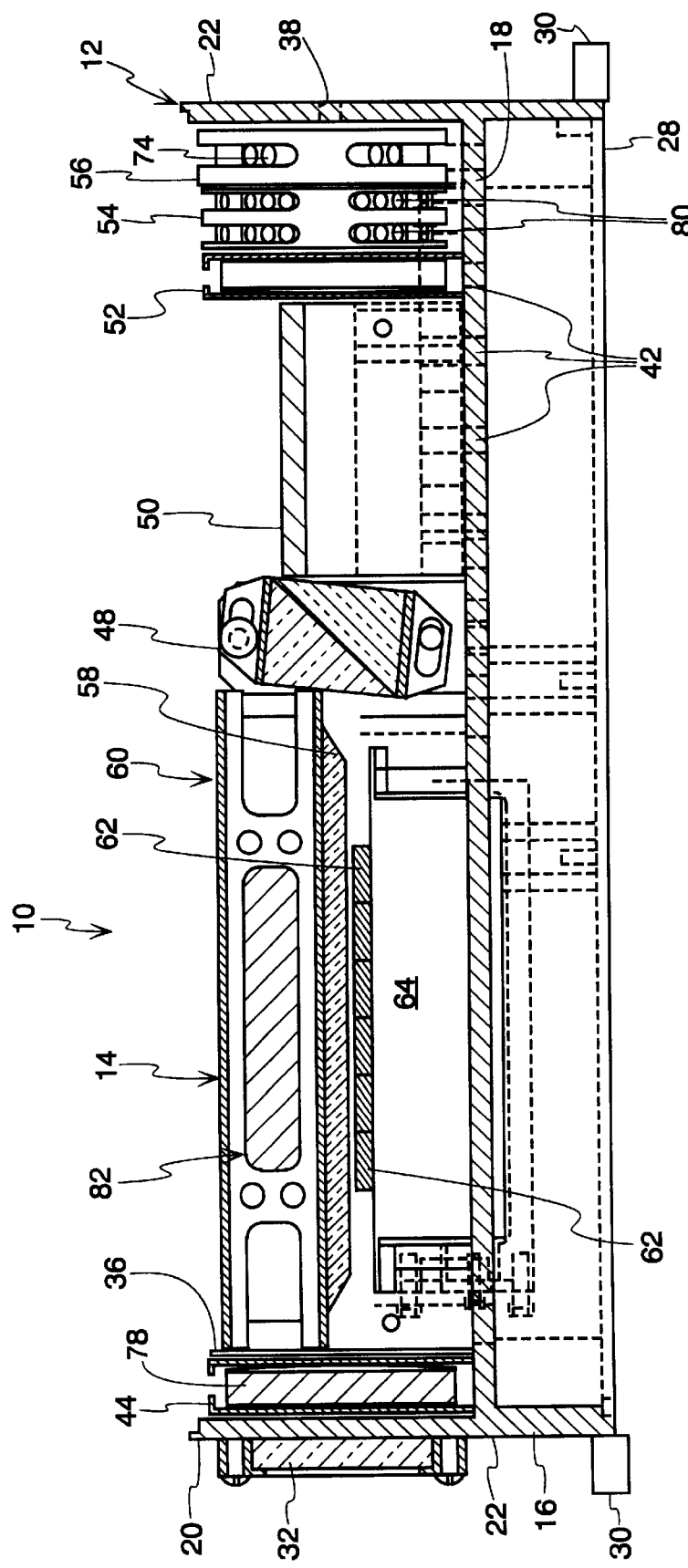
FIG. 2 is a side-elevational, cross-sectional view along 2—2 of FIG. 1 of the solid-state laser system of the present invention.

Referring now to FIG. 1 and FIG. 2, a solid-state laser system 10 for producing a high-power laser beam 11 is illustrated. The laser system 10 includes an optics bench assembly 12 that is the mounting structure for various optical components and a laser head assembly 14 which generates the high-power laser beam 11.

The optics bench assembly 12 includes the optical components (discussed below) and a housing unit 16. The housing unit 16 is a rectangular block of material (e.g. brass) with its center removed. The housing unit 16 includes a floor 18, a first end piece 20, a second end piece 22, a first sidewall 24, a second sidewall 26, and a bottom cover 28. Mounts 30 are integrally formed in the housing unit 16 to secure the laser system 10 into a larger assembly.

With particular reference to FIG. 2, the first end piece 20 includes a beam output window 32 for the exiting of the laser beam 11. The second end piece 22 includes an alignment window 38 which is centered on the axis of the laser beam 11. The alignment window 38 is covered by removable opaque plug. When the plug is removed, a low-power, eye-safe laser beam (e.g. a He—Ne laser) from an external source can be sent through this window 38 to determine where the exact location of the laser beam 11 will be when the laser system 10 is operated. Thus, the operator of the laser system 10 is not required to align the beam with the optical components.

To provide electrical connection for the laser system 10, the first sidewall 24 includes an electrical port which provides access for the wires conducting the electrical energy to the laser system 10. Wires simply pass from the internal components within the housing 16 to a connector assembly 40 located within the port. An external electrical drive and control system would then be coupled to the connector assembly 40.

As best seen in FIG. 2, the floor 18 of the housing unit 16 has several bores 42 for mounting various components. Some of these bores 42 may be threaded while some may simply act as through-bores for receiving fasteners from the underside of the optics bench assembly 12 that threadably engage threaded bores on the optical components.

Figure 3:
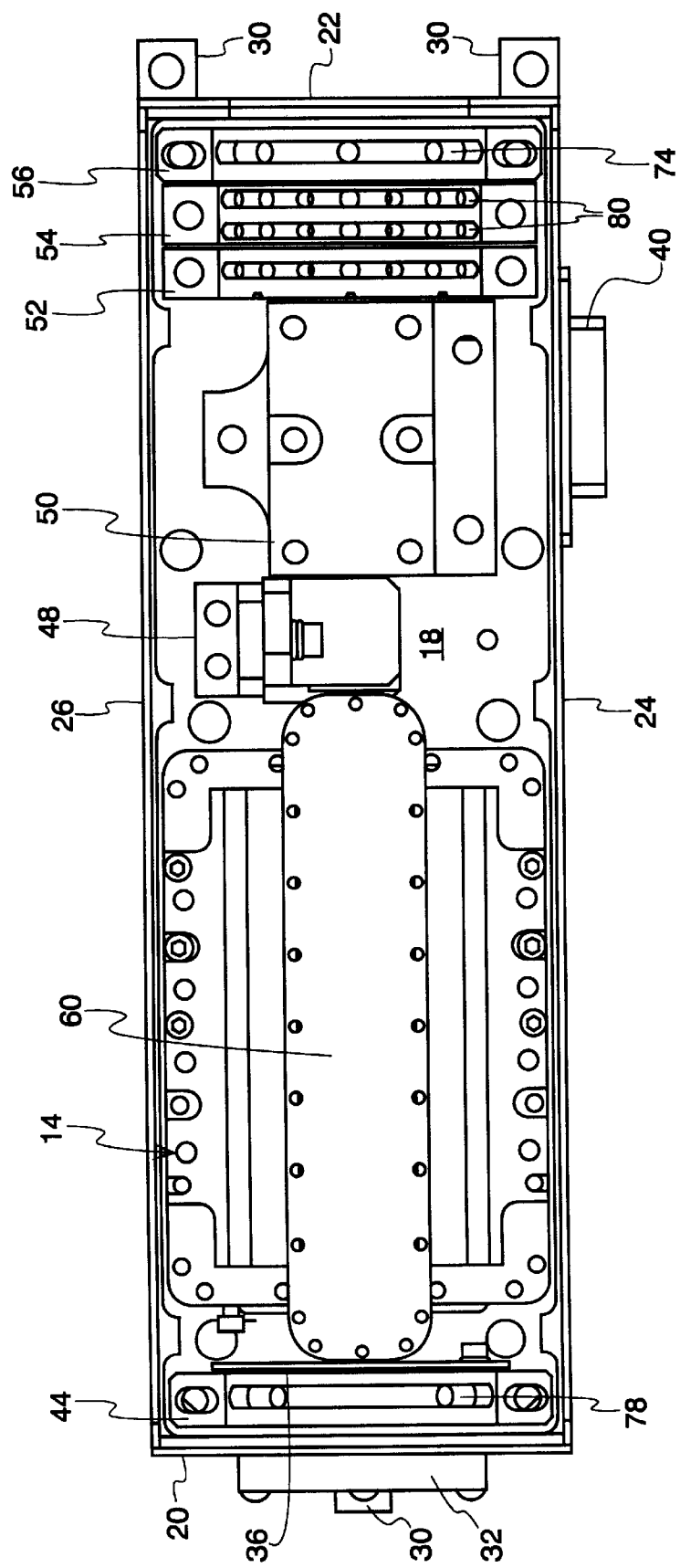
FIG. 3 is a top view of the solid-state laser system of the present invention.

FIGS. 1, 2, and 3 also illustrate the optical components utilized in one preferred operational system that provides a pulsed mode of operation. These components include an output coupling (OC) mirror assembly 44, a polarizer cube 48, an electro-optic Q-switch 50, a waveplate 52, a Risley prism pair 54, and a highly-reflective (HR) mirror assembly 56. Additionally, an aperture assembly 36 is positioned adjacent to the OC mirror assembly 44. Thus, when the laser head assembly 14 converts the electrical energy into optical energy, these optical components act upon that optical energy to produce the resultant laser beam 11.

Focusing now on FIG. 2, the laser head assembly 14 includes a laser medium 58, a laser medium heat sink assembly 60, laser diode arrays 62, and a diode array heat sink assembly 64. The laser medium 58 is disposed between the laser medium heat sink assembly 60 and the diode arrays 62 that are adjacent to the diode array heat sink assembly 64. In operation the diode arrays 62 emit energy at a first wavelength that is absorbed by the laser medium 58 and converted to energy at a second wavelength resulting in laser beam 11.

Figure 4:
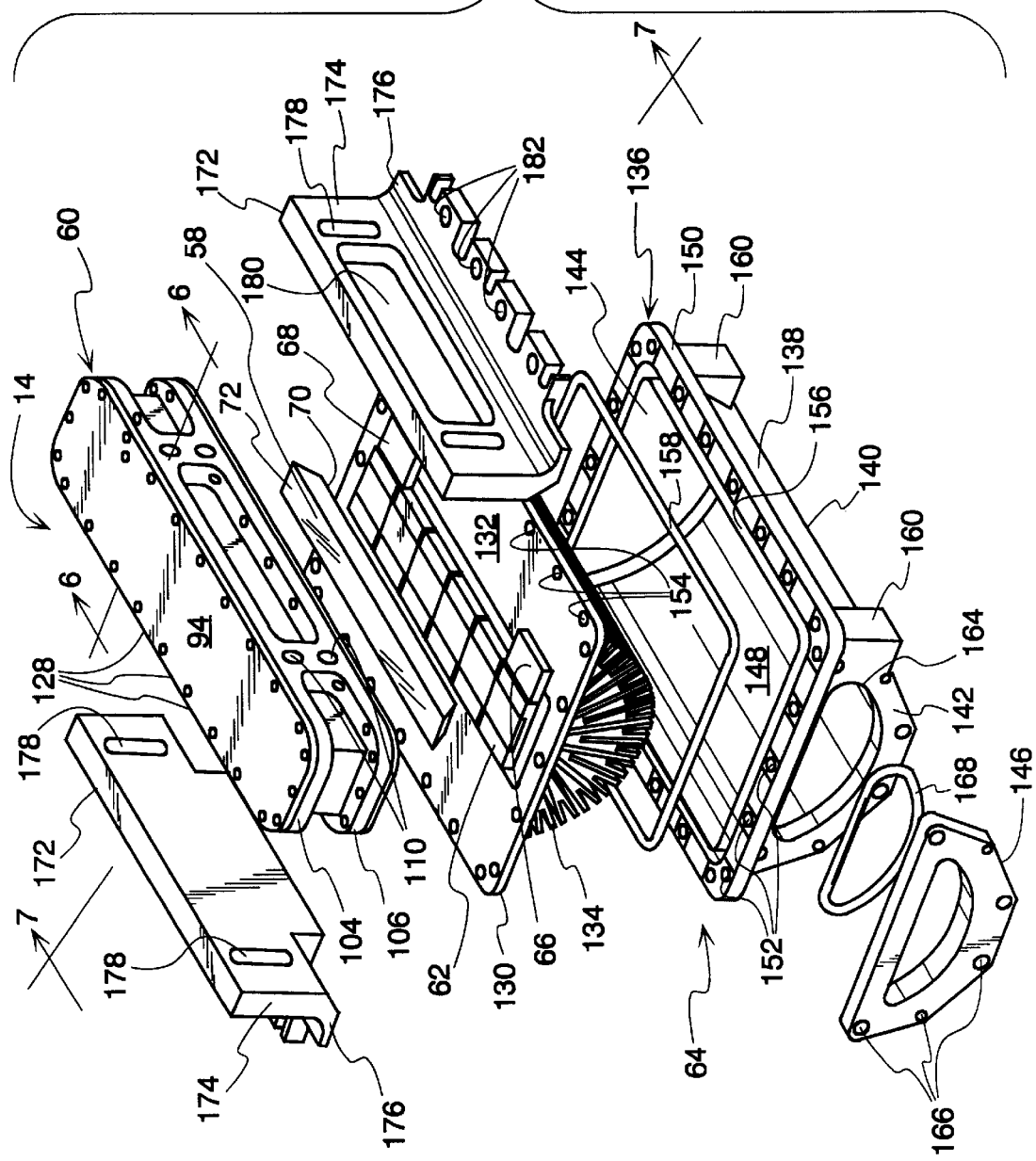
FIG. 4 is an exploded view of the laser medium heat sink assembly, diode array assembly, laser medium, and diode array heat sink assembly of the present invention.
Figure 5:
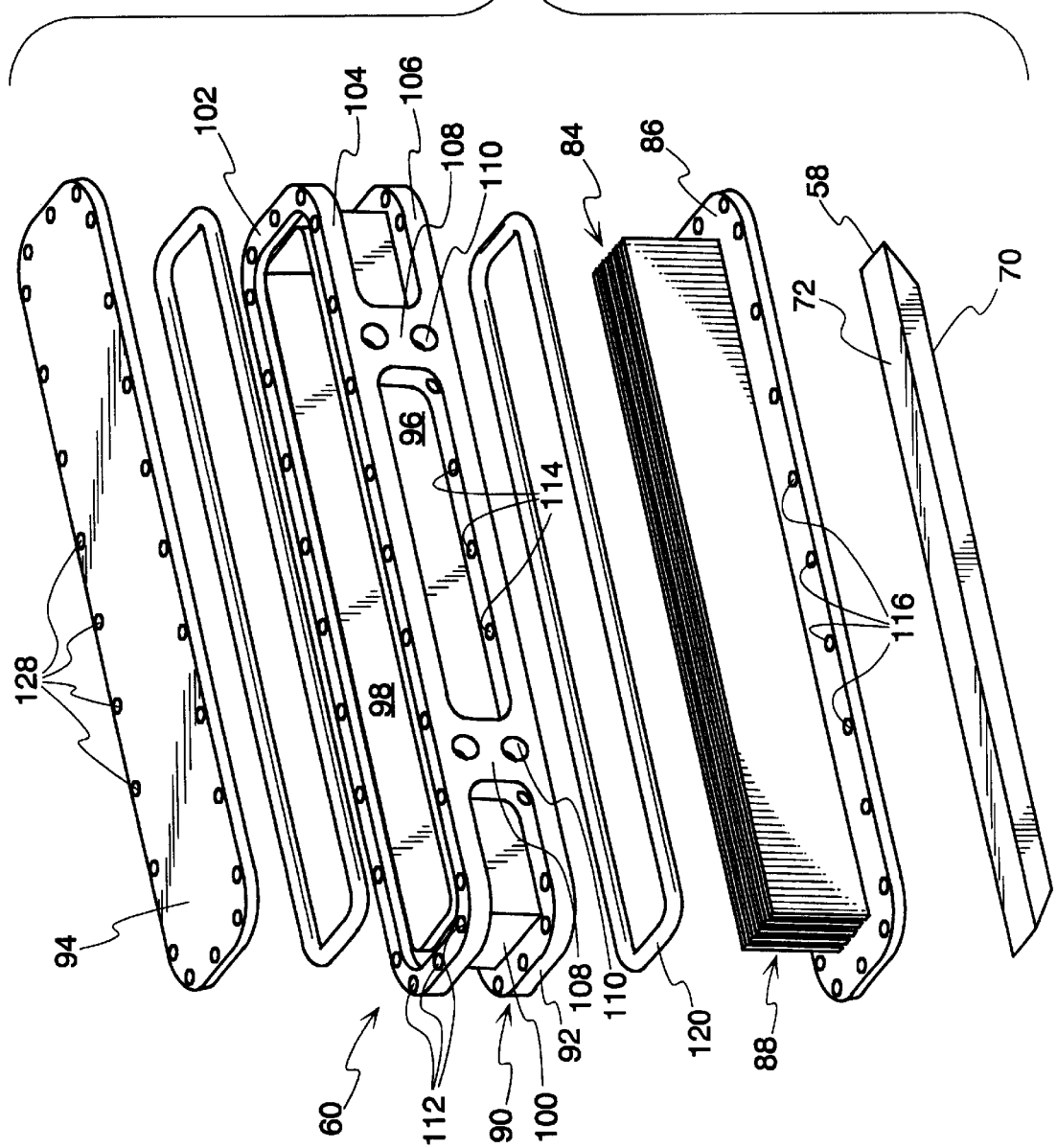
FIG. 5 is an exploded view of the laser medium heat sink assembly and laser medium of the present invention.
Figure 6:
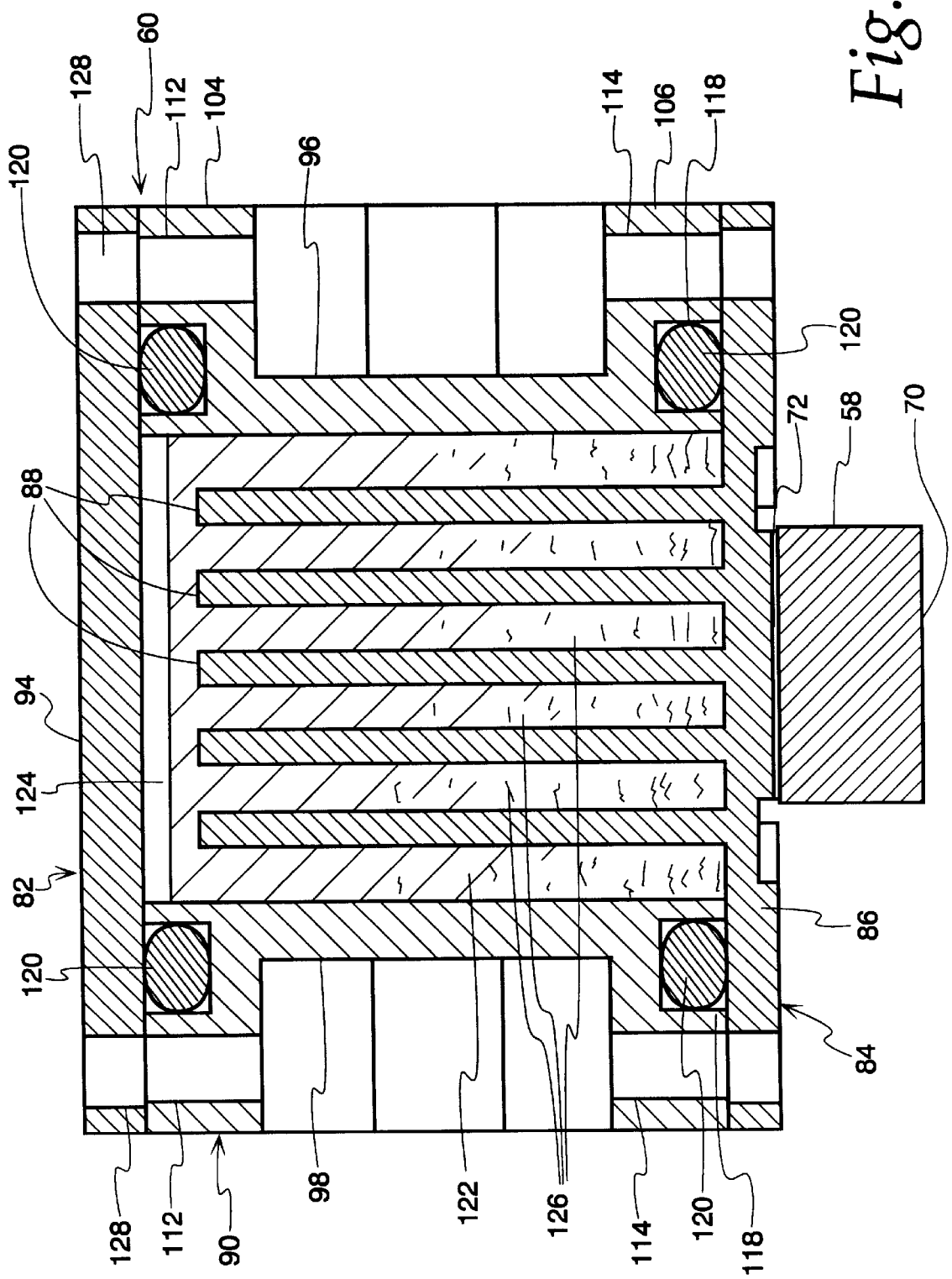
FIG. 6 is a front cross-sectional view along 6—6 of FIG. 4 of the laser medium heat sink assembly and laser medium.

Each laser diode array 62 includes a plurality of laser diode bars which convert electrical energy into optical energy. Six diode arrays 62 are shown in FIG. 4. To improve the thermal efficiency of the entire system, each laser diode array 62 is soldered to the diode array heat sink 64. The laser diode arrays 62 are usually of the type having a non-electrically conductive lower substrate (e.g. Beryllium Oxide) as shown, for example, in U.S. Pat. No. 5,128,951 to Karpinski which is herein incorporated by reference in its entirety. The laser diode arrays 62 are electronically connected in series with each other. Consequently, there is one electrical input wire connected to an input contact (solder pad) 66 and one electrical output wire connected to an output contact (solder pad) 68 for all of the laser diode arrays 62.

As mentioned above, the optical energy from the laser diode arrays 62 is absorbed by the laser medium 58. The amount of absorption of energy by the laser medium 58 at a given wavelength depends on various factors such as the type of dopants provided in the laser medium 58, the concentration of dopants, and the temperature at which the laser medium 58 is operated.

In one preferred embodiment, if the laser medium 58 is made from Neodymium (3+) doped, Yttrium-Aluminum Garnet (Nd:YAG), the peak absorption occurs at about 808 nm. Also, other laser mediums such as Nd:YLF can be used. When the laser diodes from the laser diode arrays 62 are made of gallium arsenide with aluminum doping (AlGaAs), they emit radiation at approximately 808 nm which matches the maximum absorption spectrum for the Nd:YAG material. When the laser medium heat sink 60 is approximately 30–40° C., the Nd:YAG laser medium in direct contact with the laser medium heat sink 60 absorbs the 808 nm energy well. When an Nd:YAG laser medium absorbs energy at 808 nm, it then releases energy at a wavelength of about 1064 nm that results in laser beam 11.

Still referencing FIGS. 1–3, to produce laser resonation, a reflective surface is positioned outside of each end of the laser medium 58 to cause energy to be continuously sent through the laser medium 58. At one end, the HR mirror assembly 56 is positioned adjacent to the second end piece 22 of the optics bench 12 and connected thereto with fasteners. The HR mirror assembly 56 includes a high-reflective (HR) mirror 74 with a front surface that has a reflectivity value of at least about 99% when the wavelength is 1064 nm. Also, the mirror 74 transmits energy at other wavelengths such that an alignment beam that is sent through the alignment window 38 is transmitted through the HR mirror 60 and into other optical components.

At the other end, an output coupling (OC) mirror assembly 44 is positioned adjacent to the first end piece 20 of the optics bench 12 and connected thereto with fasteners. The OC mirror 78 has a partially reflective coating on its surface such that a predetermined amount of energy is transmitted therethrough and released through the beam output window 32 as the laser beam 11. The remaining energy is reflected back through the optical components. The reflectivity of the OC mirror 78 determines the overall output in the laser beam 11. Also, the reflectivity must be enough to produce resonation through the laser medium 58. The OC mirror 78 can have a reflectivity that ranges from about 5% to about 94% (i.e. about 95% to 6% is transmitted as laser beam 11) with the optimum value being dependent on the application. In a preferred embodiment, the reflectivity of the OC mirror 78 is about 90% for a laser system 10 operating in a CW mode. For a laser system operating in a pulsed mode, the reflectivity of the OC mirror 153 is approximately 70%. An OC mirror with a reflectivity of about 80% would serve both modes of operation.

In a preferred embodiment, the polarizer cube 48 is positioned adjacent to the laser head assembly 14 and is pivotally mounted to the floor 18 of the optics bench 12. The cube 48 includes two joined prisms with alternating layers of material having high and low indices of refraction for effecting a polarization split of the laser beam 11.

If the laser system 10 is to provide a pulsed output, the electro-optic Q-switch 50 is disposed between the polarizer cube 48 and the waveplate 52, aligned with the central axis of the laser medium 58 and mounted to the floor 18 of the optics bench 12 with fasteners. When the Q-switch 50 "opens" to allow for optical transmission, energy can resonate between the two reflective surfaces such that a high-energy, short-duration pulse exits from the system 10. It should be noted that the Q-switch 50 can be placed on either side of the laser medium 58 and that other types of Q-switches, such as an acousto-optic Q-switch or passive Q-switch, can be used.

Further adjustment of the laser beam 11 is provided by the waveplate 52 and Risley prism pair 54. The waveplate 52 is positioned between the Q-switch 50 and the Risley prism pair 54 and is connected to the optics bench 12 with fasteners. The Risley prism pair 54 is positioned between the waveplate 52 and HR mirror assembly 56 and includes two prisms 80 that are rotatably mounted to the floor 18 of the optics bench 12. The Risley prism pair 54 is used to substantially linearly deflect a beam of wave energy. The prisms 80 can be rotated to effectuate maximum resonation of beam energy along the central axis of the laser medium 58. The waveplate rotates the polarization state of the laser beam 11 to allow proper Q-switch operation.

The laser system 10 may require a specific internal environment for optimum operation. For example, a cover can completely enclose and seal the system 10 which then could be back-filled with dry nitrogen if it is equipped with a simple valve on its external surface. Alternatively, the final assembly step could be performed in a low-moisture atmosphere. In yet a further alternative, the laser system 10 may include a desiccant within the housing 14 that absorbs the moisture once a cover is sealed in place.

To provide passive cooling, the laser diodes 62 and laser medium 58 are heat sunk to unique heat exchangers having phase change materials. These components are illustrated in FIGS. 4–7 and will now be described.

Referring now FIGS. 4–7, exploded and cross-sectional views of the laser medium heat sink assembly 60, the diode array heat sink assembly 64 and laser medium 58 are shown. The laser medium heat sink assembly 60 includes a laser medium heat exchanger 84 with a base plate 86 having a plurality of fins 88 and a housing 90 for enclosing the heat exchanger 84. The laser medium heat exchanger 84 can be made from any highly-conductive and preferably light-weight material including metals, metal composites, and highly-conductive non-metals.

In a preferred embodiment, the fins 88 are substantially rectangular in shape, extend along the length of the laser medium 58, and are disposed parallel with respect to each other to form interstices 126 therebetween. The fins 88 may have a variety of shapes and are not limited to the substantially rectangular fins 88 shown in FIG. 5. Other variations that produce heat-conducting extended surfaces include tube fins, spines, grooves, plate fins of other shapes, plate baffle constructions, internal fin-tube constructions, and a shell-and-tube construction. While the fins 88 are copper and shown as parallel, they can be made from any highly-conductive metal or non-metal and have a radial configuration as is shown with respect to the laser diode array heat sink 64.

The housing 90 includes a body 92 and a cover 94. The body 92 is formed by machining a substantially rectangular block of material (e.g. brass or copper) to remove its center portion leaving a substantially rectangular collar with a first sidewall 96, a second sidewall 98, a first end wall 100, and a second end wall 102. The inner surfaces of the walls 96, 98, 100, 102 are fairly smooth. The body 92 has an integrally formed upper lip 104 at the upper portion of the walls 96, 98, 100, 102 and a lower lip 106 at the lower portion of the walls 96, 98, 100, 102. The upper and lower lips 104, 106 extend outwardly from the walls 96, 98, 100, 102 and are interconnected by integrally formed pillars 108 having bores 110 machined therein for accepting fasteners. The housing 90 can be made from materials other than copper or brass and, preferably, from materials that are non-corrosive and light-weight.

A plurality of apertures 112 are formed in the upper lip 104 to be in positional agreement with a plurality of apertures 114 formed in the lower lip 106. The apertures 112 and 114 are also in registry with apertures 116 in the base plate 86 of the laser medium heat exchanger 84. The lower portion of the body 92 has an integrally formed channel 118 (FIG. 6) for receiving an O-ring 120 to prevent leaks. The body 92 is secured to the base plate 86 of the laser medium heat exchanger 84 with fasteners passed through apertures 114 in the lower lip 106 and apertures 116 in the base plate 86 sandwiching the O-ring 120 between the base plate 86 and the body 92. The upper portion of the body 92 has a similar channel for accepting an O-ring.

Once the body 92 is mounted to the base plate 86 of the heat exchanger 84, phase change material (PCM) 122 is added within a chamber 124 defined by the inner surfaces of the walls 96, 98, 100, 102 of the body 92, and the interstices 126 of the fins 88. The cover 94 is then added to the assembly which is a substantially rectangular plate having apertures 128 in positional agreement with the apertures 112 of the upper lip 104 for accepting fasteners. The cover 94 seals the chamber 124. In an alternative embodiment, the housing 90 can constitute a unitary body.

As shown in FIG. 4, six diode arrays 62 are disposed adjacent to a lower face 70 of the laser medium 58. The lower face 70, where the energy from the laser diode arrays 62 enters the surface of the laser medium 58, is covered with a coating that allows external transmission of 808 nm radiation but is internally reflective of 1064 nm radiation. An upper face 72 of the laser medium is covered with a coating reflective of both 1064 and 808 nm radiation. One example of such a coating is 2000 Angstroms of silver which is deposited on the laser medium 58 with a vacuum-evaporation process. Thus, optical energy from the diode arrays 62 enters the laser medium 58 at the lower face 70, travels through the laser medium 58, bounces off the internally reflective coating on the upper surface 72 and is transmitted back through the laser medium 58. This path is sufficiently long for the laser medium 58 to absorb most of the energy from the laser diode arrays 62. Any heat produced in the laser medium 58 is conducted into the laser medium heat exchanger 84.

To efficiently conduct heat from the laser medium 58 to the laser medium heat sink assembly 60, the laser medium 58 preferably is attached to the base plate 86 with highly conductive material. A preferred embodiment involves attaching the laser medium 58 directly to the laser medium heat sink assembly 60 with a thermally conductive adhesive such as a thermally conductive room temperature vulcanization (RTV) epoxy.

Figure 7:
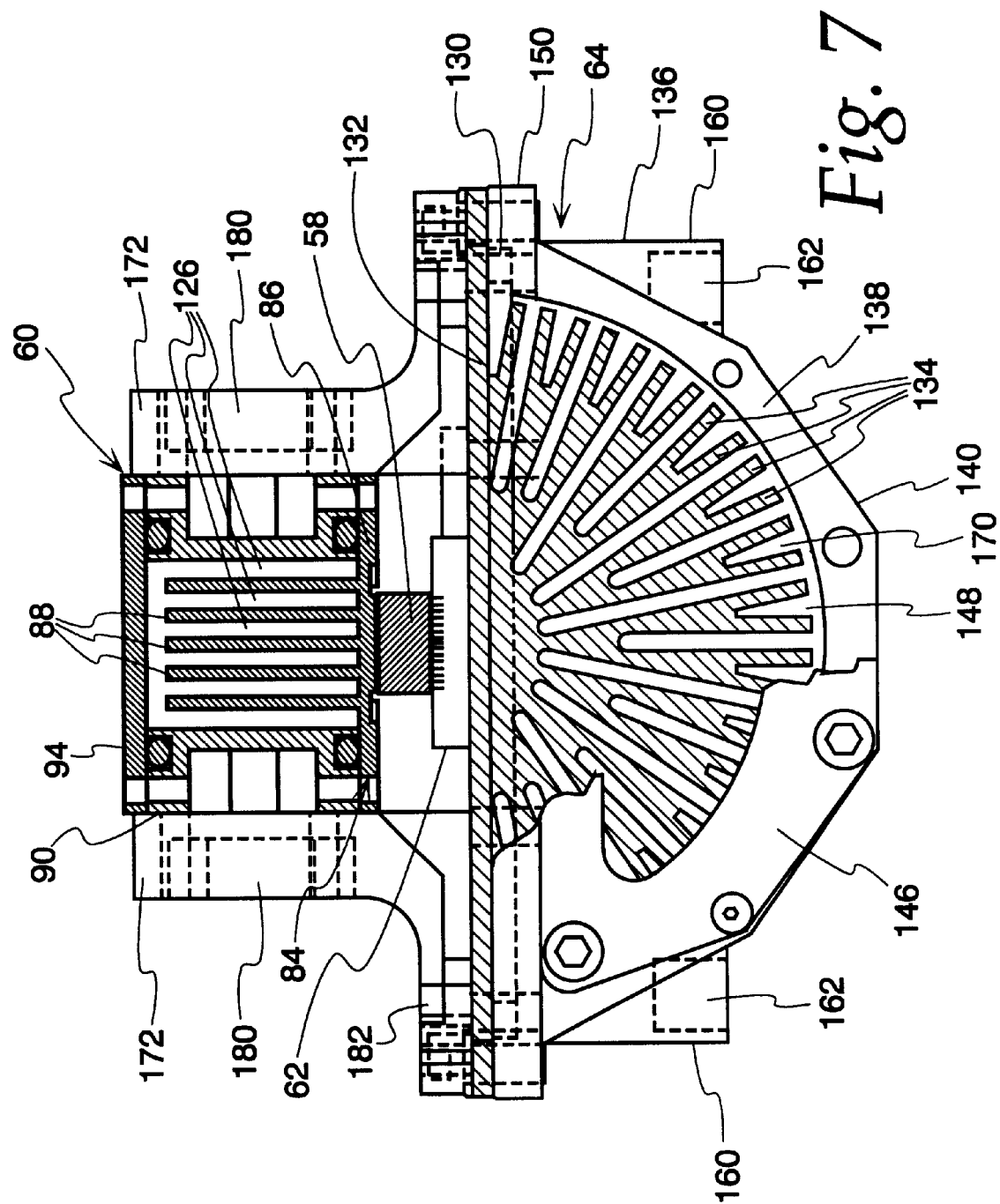
FIG. 7 is a front cross-sectional view along 7—7 of FIG. 4 showing the laser medium heat sink assembly, laser medium, diode array, and diode array heat sink assembly.

Referring now to FIG. 7 and with particular reference to FIG. 4, cross-sectional and exploded views of the laser head assembly 14 are shown. The diode array heat sink 64 includes a diode array heat exchanger 130 with a base plate 132 having a plurality of fins 134 and a housing 136 for enclosing the heat exchanger 130.

In a preferred embodiment, the fins 134 are branched and extend radially from the base plate 132 along the length of the laser medium 58. The extended surfaces may have a variety of shapes and are not limited to the radially branched fins shown in FIG. 4. Other variations can include tube fins, spines, grooves, plate fins of other shapes, plate baffle constructions, internal fin-tube constructions, and a shell-and-tube construction.

The housing 136 includes a body 138 having a semi-cylindrical surface 140, a first end wall 142, a second end wall 144, and an access cover 146 defining a chamber 148 in which a phase change material is placed. At an upper end, the body 138 has a lip 150 integrally formed therewith. Apertures 152 formed in the lip 150 accept fasteners and are in registry with apertures 154 of the base plate 132. A channel 156 for accepting an O-ring 158 is also integrally formed in the body 138 at the upper end.

Because the heat exchanger 130 is filled with phase change material, the first end wall 142 has a hole 164 for providing access to the chamber 148 within the body 138. The access cover 146 includes apertures 166 and an integrally formed channel for accepting an O-ring 168 to provide sealing engagement with the first end wall 142. The access cover 146 is secured to the first end wall 142 with fasteners.

When the base plate 132 is mounted on the lip 150, a sealing engagement is formed with the O-ring 158 positioned within the channel 156. With the apertures 154 of the base plate 132 in alignment with the apertures 152 in the lip 150, fasteners are passed therethrough to securely mount the diode array heat exchanger 130.

To mount the diode array heat sink 64 to the optics bench 12, fasteners are passed from the optics bench 12 to bores 162 in mounting pillars 160.

The diode arrays 62 are directly contacting the base plate 132 of the heat exchanger 130 to thermally conduct heat away from the diode arrays 62 and into the diode array heat sink 64. Thus, heat produced by the diodes is transferred into the heat sink 64 where it is ultimately absorbed by the PCM.

To place the laser medium 58 directly over the laser diode arrays 62, brackets 172 position and secure the laser medium heat sink assembly 60 to the base plate 132 of the diode array heat exchanger 130. Each bracket 172 has a plate 174 with an integrally formed flange 176. The plate 174 has two slots 178 aligned with bores 110 in the heat sink body 92 for passing fasteners therethrough. The flange 176 of the bracket 172 has apertures 182 for securing the bracket 172 to the base plate 132 of the diode array heat exchanger 130.

Because of the desire to reduce the weight of the overall system, additional material is machined from the various components in areas where the structural integrity of the system 10 is not compromised. For example, a recess 180 is also formed in the plate 174 for reducing the weight of the unit.

The phase change material (PCM) 122 placed within the chamber 124 of the laser medium heat sink assembly 60 and the PCM 170 placed into the chamber 148 of the diode array heat sink 64 change from solid to liquid at a desired temperature depending upon the demands of a particular application. Selecting as a working medium a PCM that transitions from solid to liquid as opposed to liquid to gas is advantageous in that the PCM dissipates waste heat by conduction as opposed to conduction and convection. Also, the PCM provides thermal control of elements in thermal communication with the PCM. Thermal control is provided by the PCM's latent heat associated with the phase change. A PCM in its solid phase will continue to absorb energy and remain in its "melt phase" at a known temperature until a specified amount of heat is absorbed to complete the entire transition from solid to liquid phase. Thus, any element in intimate contact with the PCM undergoing a phase change will be held at a generally constant temperature that coincides with the PCM's melting temperature until the phase change is complete.

The duration of the phase change associated with a particular amount of PCM affects the time period for operating the laser system before reaching catastrophic temperature levels. Selecting a PCM requires consideration of factors other than the desired control temperature and operation period associated with the particular laser application and design. One factor is the ambient temperature of the environment in which the laser system 10 is to operate. A PCM is selected that has a melting point above the maximum ambient temperature of the environment in which the laser system 10 resides so that the PCM will remain in its solid phase before laser operation begins. This temperature is preferably in the range of −35 to 55° C. Other factors include the desired laser power output, size of both the laser medium and the laser diode array, and the efficiency of the laser diodes and laser medium which is proportional to the waste heat.

In a preferred embodiment, gallium is selected as the PCM to serve as the working medium. Gallium has a melting point of 29.8° C. and a latent heat of fusion of 80 J/g. The melting point of gallium closely corresponds to an acceptable operational temperature (30°C.) of the Nd:YAG material of the laser medium in the preferred embodiment. Since it is possible for a PCM to be a solid at room temperature but a liquid slightly above room temperature, integrating the PCM into a heat exchanger is fairly easy. Other possible PCMs include alkyl hydrocarbons, salt hydrates, and low temperature metallic alloys (fusible alloys).

However, gallium, even when in its liquid phase, does not easily wet to copper or other materials from which the heat exchanger may be constructed. One method for integrating the PCM into a heat exchanger includes heating the heat exchanger to a temperature above the liquid phase of the PCM. This step makes it easier to maintain the PCM in its liquid phase while it is poured into the heat exchanger. The next step involves heating the PCM until it melts to facilitate the transfer of PCM into the heat exchanger. Next, the heat exchanger is coated with a highly active organic fluxing agent such as Flux No. 4 by the Indium Corporation of America of Utica, N.Y. which helps the PCM wet onto the surface of the heat exchanger. Then, the PCM is injected or poured into the heat exchanger. Finally, excess fluxing agent is removed. The last two steps may be performed simultaneously.

The laser system 10 including a slab-shaped Nd:YAG laser medium 58 having dimensions of 3.1 mm (thickness) by 6.2 mm (width) by 83.3 mm (distance tip-to-tip) has been tested. This slab was bonded to a gallium-filled heat sink with thermally conductive RTV. The laser medium heat exchanger 84 with fins 88 was machined from copper and the chamber 124 had a gallium PCM volume of 0.26 in$^3$.

Six diode arrays each having 15 diode bars were soldered to the diode array heat sink. The diode array heat exchanger was also machined from copper having radially extending fins that circumscribe a semi-circle having a radius of 0.82 in. The chamber 148 of the diode array heat sink having a PCM volume of 1.2 in$^3$ was filled with gallium.

Figure 8:
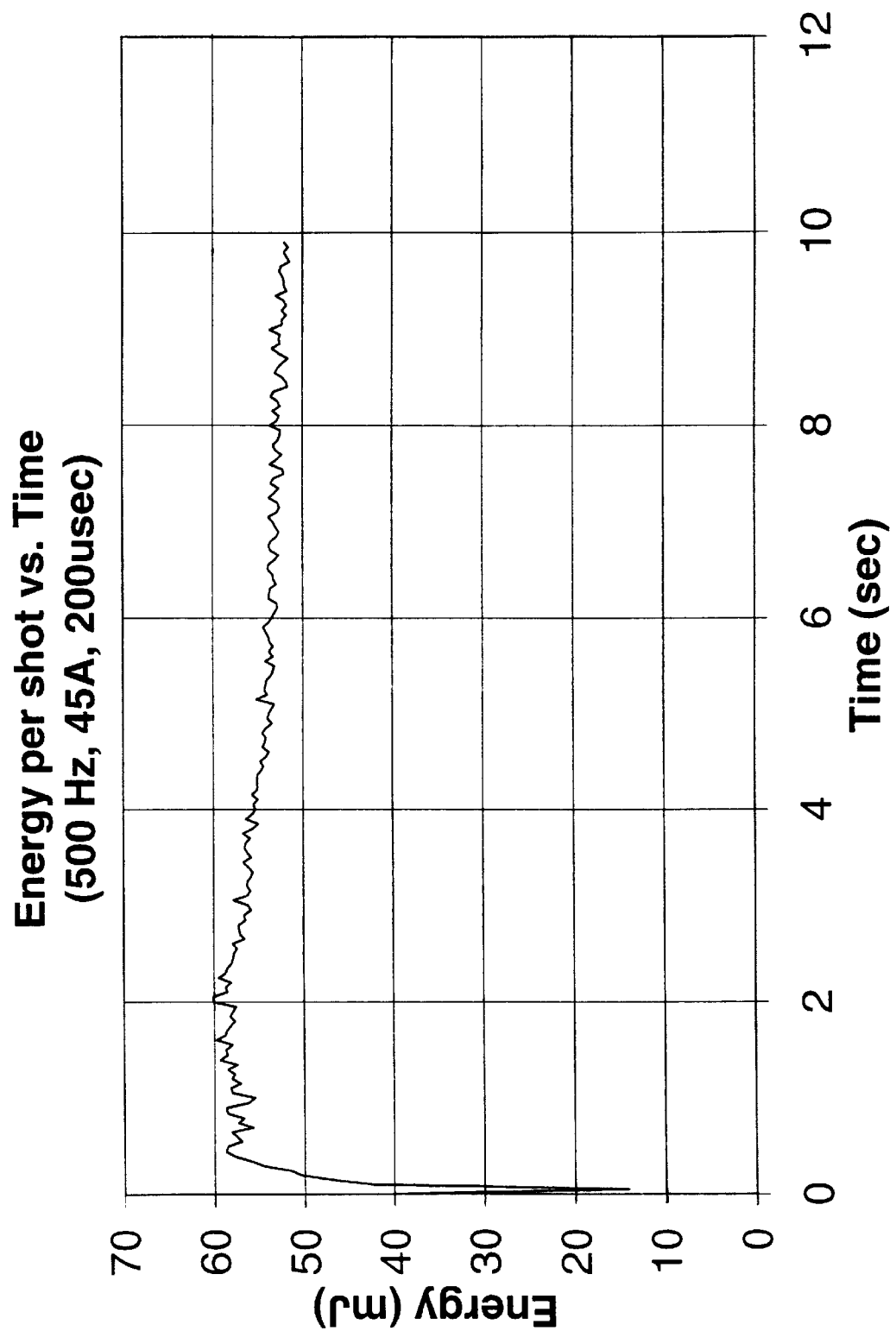
FIG. 8 is a plot of the output of the laser system versus time when operated at an input current of 45 A, repetition rate of 500 Hz, and pulsewidth of 200 $\mu$sec.

Referring now to FIG. 8, there is shown a plot of the output of the laser system 10 versus time when the system was operated at an electrical input of 45 A, a repetition rate of 500 Hz, a current pulsewidth of 200 µsec and the physical conditions described in the previous paragraph. For a maximum energy output of about 60 mJ, the maximum laser output power is 30 W of 1064 nm energy. The corresponding heat load produced by the slab was calculated to be 83 W and the heat load produced by the diode arrays was calculated to be 520 W. If the power output of the entire system is desired to be less than 30 W, then the time of temperature-controlled operation of the slab and arrays will increase proportionally.

Figure 9:
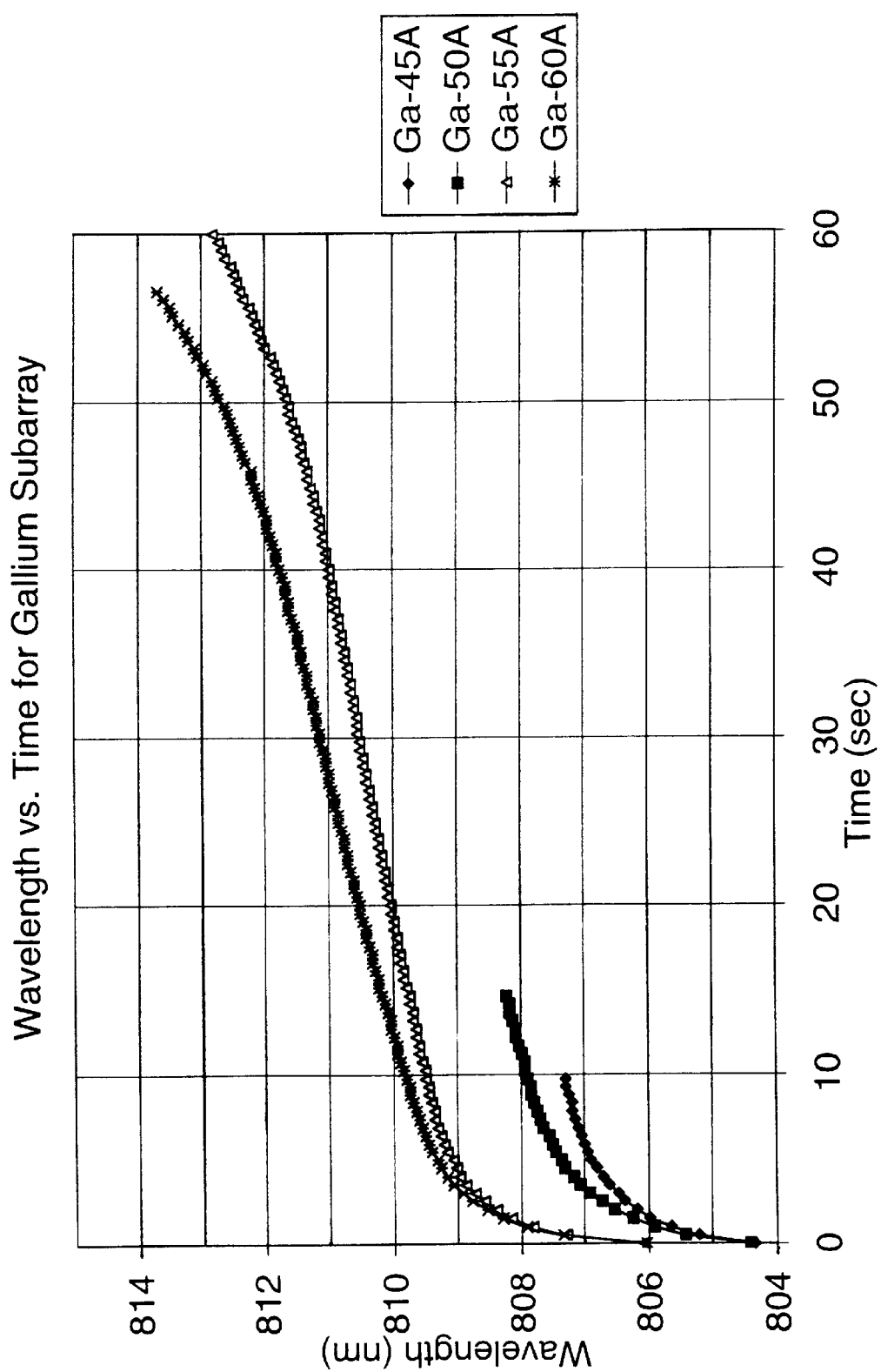
FIG. 9 is a plot of output power wavelength versus time for test runs at peak input currents of 45, 50, 55, and 60 A.

Referring now to FIG. 9, there is shown a plot of the output power wavelength versus time for test runs at peak input currents of 45, 50, 55, and 60 A, a 250 µsec pulsewidth, and repetition rate of 500 Hz but under different physical conditions than described above. The physical conditions included only one diode subarray as opposed to the six previously described. Furthermore, a slightly larger diode array heat exchanger was used. The heat exchanger had twice the effective cross-sectional area for heat dissipation and the fins circumscribed a semi-circle having a radius of 1.16 in instead of 0.82 in previously described. Since the amount of heat dissipation is directly proportional to the effective cross-sectional area, the amount of heat dissipation can be easily calculated if more diode subarrays are added. As a reference point, at 60 A, the waste heat of the diode arrays is about 140W.

Aluminum doped gallium-arsenide (AlGaAs) diodes shift wavelength by one nanometer for approximately 4° C. change in temperature. For example, over a time period of approximately 60 seconds at an input current of 60 A, the corresponding temperature change of approximately 32° C. was measured (814 nm–806 nm). However, at an input of 60 A and after approximately 3 seconds, the wavelength remains relatively stable for approximately 50 seconds (809 nm to about 812 nm). This flattening out of the curves is associated with the latent heat of fusion of gallium. After about 50 seconds, the rate of the change in wavelength is shown to begin to increase. This change corresponds with the point in time when gallium has completely melted after which gallium behaves as a normal superheated liquid.

In addition, stress tests to verify the survivability of the laser medium slab were conducted at various heat loading levels. For these tests, the slab was bonded with thermally conductive RTV to a gallium-filled diode array heat sink assembly 64 having a PCM volume of 0.26 in$^3$. Various heat loading levels were used and no damage to the slab was observed at an input power of 55 A, 250 µsec pulsewidth, repetition rate of 500 Hz, and run-time of 20 seconds.

It should be noted that after the system is operated, it returns to its starting point prior to operation because the gallium phase change material will eventually solidify. Once at its starting point, the laser system 10 can be operated again.

To accelerate the solidification of the PCM and reduce the delay before the laser diode array assembly can be operated again, the PCM, in an alternative embodiment, is in thermal communication with a secondary heat exchanger utilizing active cooling. This alternative embodiment is generally illustrated in FIGS. 10–13 and will now be described.

Figure 10:
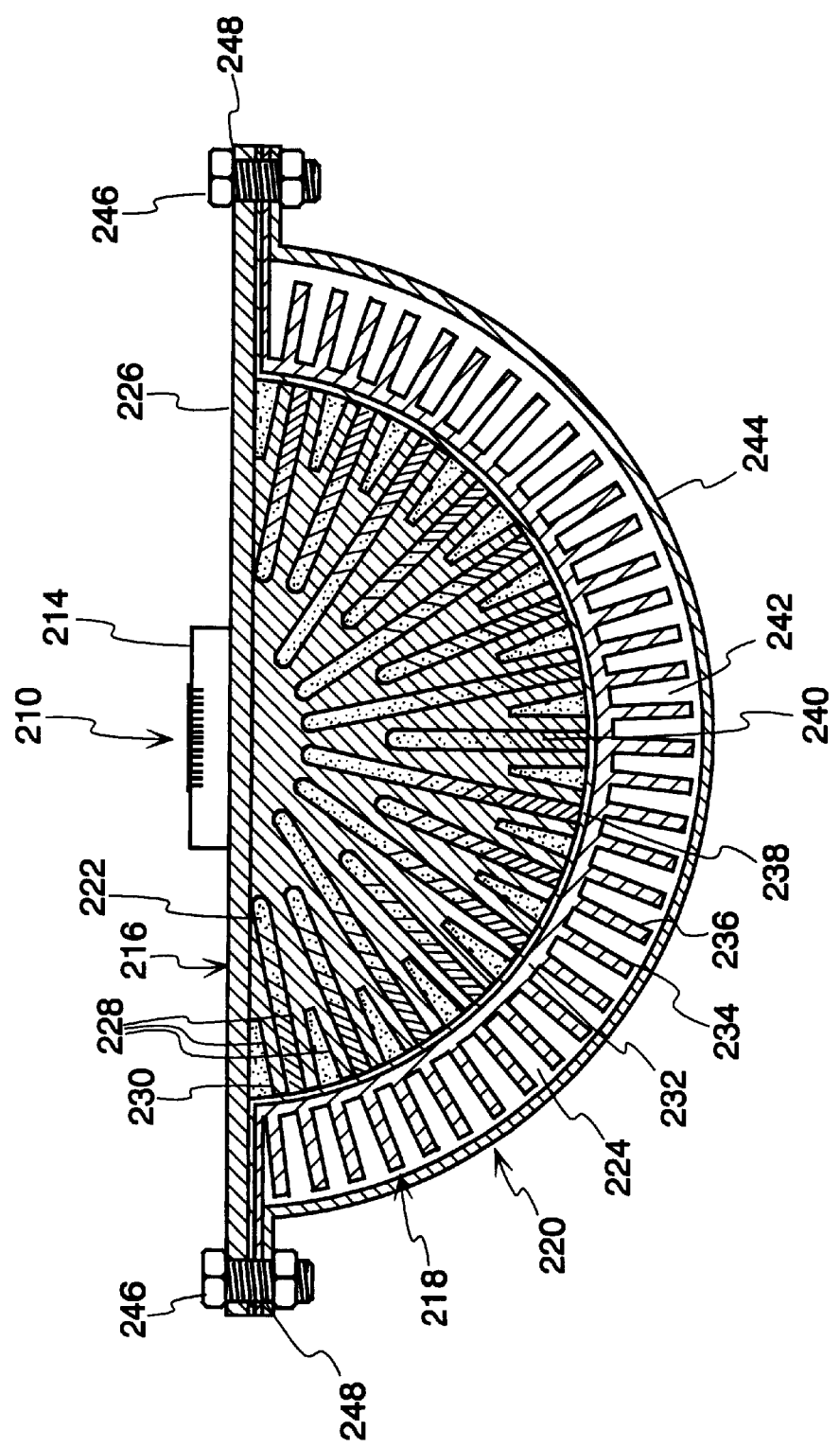
FIG. 10 is a cross-sectional view of the heat sink assembly, heat exchanger, and laser diode array.

Referring now to FIG. 10, a laser diode array assembly 210 includes a laser diode array 214, a heat sink assembly 216, and a heat exchanger 218. For simplicity, the heat sink assembly 216 and heat exchanger 218 will be called a dual-stage temperature control system 220. The heat sink assembly 216 contains a PCM 222 which is in thermal communication with an active heat exchanger 218 containing a working fluid 224. The heat sink assembly 216 includes a base plate 226 and a plurality of fins 228. As illustrated, the fins 228 are branched and extend radially from the base plate 226 along a length that is preferably as long as the laser diode array 214. The extended surfaces 230 may have a variety of shapes and are not limited to the radially branched fins 228 shown in FIG. 10. Other variations include tube fins, spines, grooves, plate fins of other shapes, plate baffle constructions, internal fin-tube constructions, and a shell-and-tube construction.

The active heat exchanger 218 includes a contact plate 232 and a plurality of fins 234. The fins 234 extend outwardly from the contact plate 232 preferably along a length at least as long as the laser diode array 214. The extended surfaces 236 may have a variety of shapes and are not limited to the radially branched fins 234 shown in FIG. 10. Other fin variations for the heat exchanger include tube fins, spines, grooves, plate fins of other shapes, plate baffle constructions, internal fin-tube constructions, and a shell-and-tube construction.

The contact plate 232 conforms closely to the shape generally defined by the outer perimeter of the fins 228 of the heat sink assembly 216. Before the contact plate 232 is positioned, a retaining plate 238 may be used to enclose the heat sink assembly 216 and generally define a first chamber 240 in which PCM 222 is placed. Alternatively, without a retaining plate 238, the contact plate 232 alone would serve to enclose the fins 228 and generally define a first chamber 240 in which the PCM 222 is placed. A sheet of indium foil may be laid over and pressed onto retaining plate 238 to reduce the thermal resistance at the interface between the retaining plate 238 and the contact plate 232.

A second chamber 242 through which the working fluid 224 flows is generally defined by a heat exchanger cover 244 that encloses the fins 234. The cover 244 and the heat exchanger 218 are firmly secured to the base plate 226 by passing fasteners 246 into apertures 248 of the base plate 226 to engage all of the components. The second chamber 242 is provided with an inlet and outlet for the forced exchange of working fluid 224. The working fluid 224, which can be any fluid such as air, water, or a fluorocarbon refrigerant, flows through the second chamber 242 to receive waste heat from the PCM 222 of heat sink assembly 216. Also, the PCM 222 can be cooled by natural convection of air through the heat exchanger 218. In a further alternative, an expansion bottle, wherein a gas expands from its compressed state, can be used to cool the heat exchanger 218.

FIG. 11 illustrates the laser diode array assembly 210 with an alternative dual-stage temperature control system 249 formed by electrical-discharge machining (EDM). The dual-stage temperature control system 249 includes a first set of cavities 250 for receiving PCM and a second set of interconnected cavities 252 for receiving working fluid 224. Both sets of cavities 250, 252 are formed within the same block of metal (e.g. brass or copper) such that the cavities 252 containing working fluid 224 are interposed between the cavities 250 of PCM. Preferably, the PCM cavities 250 are located proximate to the heat-generating component, such as the diode array 214, relative to the cavities 252 of working fluid. While elongated and radially extending cavities 250, 252 are depicted in FIG. 11, the cavities 250, 252 may be of any shape, length, and interposed configuration for effective heat transfer.

The laser diode array assembly 210 including yet another embodiment of the dual-stage temperature control system 253 formed by EDM is shown in FIG. 12. The dual-stage temperature control system 253 includes a first set of PCM cavities 254 proximately located to the diode array 214 relative to a second set of cavities 256 containing working fluid. In this embodiment, all of PCM cavities 254 are adjacent to each another and all of the working fluid cavities 256 are adjacent to each other. While elongated and radially extending cavities 254, 256 are shown in FIG. 12, the cavities 254, 256 may be of any shape, length, and configuration for effective heat transfer.

While the embodiments shown in FIGS. 10–12 depict dual-stage temperature control systems 220, 249, 253 used for cooling a diode array 214, the dual-stage temperature control system 220 can be used to cool any heat-generating component in the laser system. These components include the laser medium (e.g. ND:YAG), beam dumps, acousto-optic Q-switches, and nonlinear crystals.

With particular reference to FIG. 13, there is shown a laser medium 258 in thermal communication with a first dual-stage temperature control system 260 and a diode array 262 in thermal communication with a second dual-stage temperature control system 264. A fluid circuit 266, schematically illustrated in FIG. 13, is connected to the systems 260, 264. The first and second dual-stage temperature control systems 260, 264 include respective first stage elements 268, 269 containing PCM and respective second stage elements 270, 271 utilizing working fluid for active cooling. The first stage elements 268, 269 of the first and second dual-stage temperature control systems 260, 264 are located proximate to the laser medium 258 and diode array 262, respectively, relative to the second stage elements 270, 271. The second stage elements 270, 271 have inlets 272, 273, respectively, and outlets 274, 275, respectively, for circulating working fluid therethrough and removing waste heat. The first stage elements 268, 269 and second stage elements 270, 271 can be of any configuration described previously in reference to FIGS. 10–12. Alternatively, the first stage elements 268, 269 of the first and second dual-stage temperature control systems 260, 264 can be similar to the laser medium heat sink assembly 82 and the diode array heat sink assembly 64, respectively, previously described in reference to FIGS. 4–7.

While each of the second-stage elements 270, 271 can be connected to a separate fluid circuit, FIG. 13 schematically illustrates a single fluid circuit 266 having a valve 276, a pump 278, and a heat exchanger 280 for use with both second-stage elements 270, 271. The fluid circuit 266 enables a working fluid, either a liquid or a gas, to be passed through each second stage element 270, 271 so as to control the temperature of the second stage elements 270, 271. This controls the flux of thermal energy between first and second stage elements 268, 269 and 270, 271, respectively. The temperature of the second stage elements 270, 271 may be controlled by the circuit 266 by controlling the volumetric flow rate of the fluid through the circuit 266 by the valve 276 or the pump 278, the inlet temperature of the fluid to the second stage elements 270, 271, the fin structure, and the physical properties of the fluid.

By controlling the temperature of second stage elements 270, 271, the temperature of the PCM contained within the first stage elements 268, 269 can be maintained at its melt-phase temperature. In turn, the selection of a PCM having a melting temperature approximately equal to the operating temperature of the laser component, affords proper control of the temperature of the laser component. Preferably, the melting temperature of the PCM is within about 5° C. of the operating temperature of the laser component.

Further, if the laser component is to be temporarily operated at a higher level producing additional waste heat, the system maintains the laser component at its proper temperature. This is especially useful when the temperature of the working fluid is set at a constant temperature. In this case, the additional waste heat causes more melting of the PCM, while still maintaining the temperature of the heat sink base plate at approximately the same temperature. Accordingly, the laser component is maintained at the same temperature. Similarly, when the laser component is temporarily operated at a lower level, producing less waste heat, less PCM is melted. Thus, the heat sink with the PCM can be thought of as a thermal buffer allowing for increases and decreases in operating levels without a change in the temperature of the laser component. In essence, the need for an electronic feedback loop for thermal control of the laser component is avoided as thermal control is provided by the latent heat of the PCM.

The PCM also provides thermal control of the laser component when the temperature of the working fluid fluctuates. When the working fluid is the ambient air and the system is operated without a PCM heat sink, the temperature of the laser component would generally rise and fall by an amount equal to the change in the ambient temperature. However, a system having a heat sink assembly containing a PCM will better maintain the laser component at its operating temperature as the temperature of the ambient air fluctuates. By way of example, when a heat sink containing gallium is used (i.e. melting temperature of about 30° C.) and the ambient air through the heat exchanger is fluctuating between about 20° C. and 30° C., a temperature sensitive laser component in contact with the heat sink can still be operated at a relatively constant temperature (e.g. about 35° C. to 40° C.).

Figure 14:
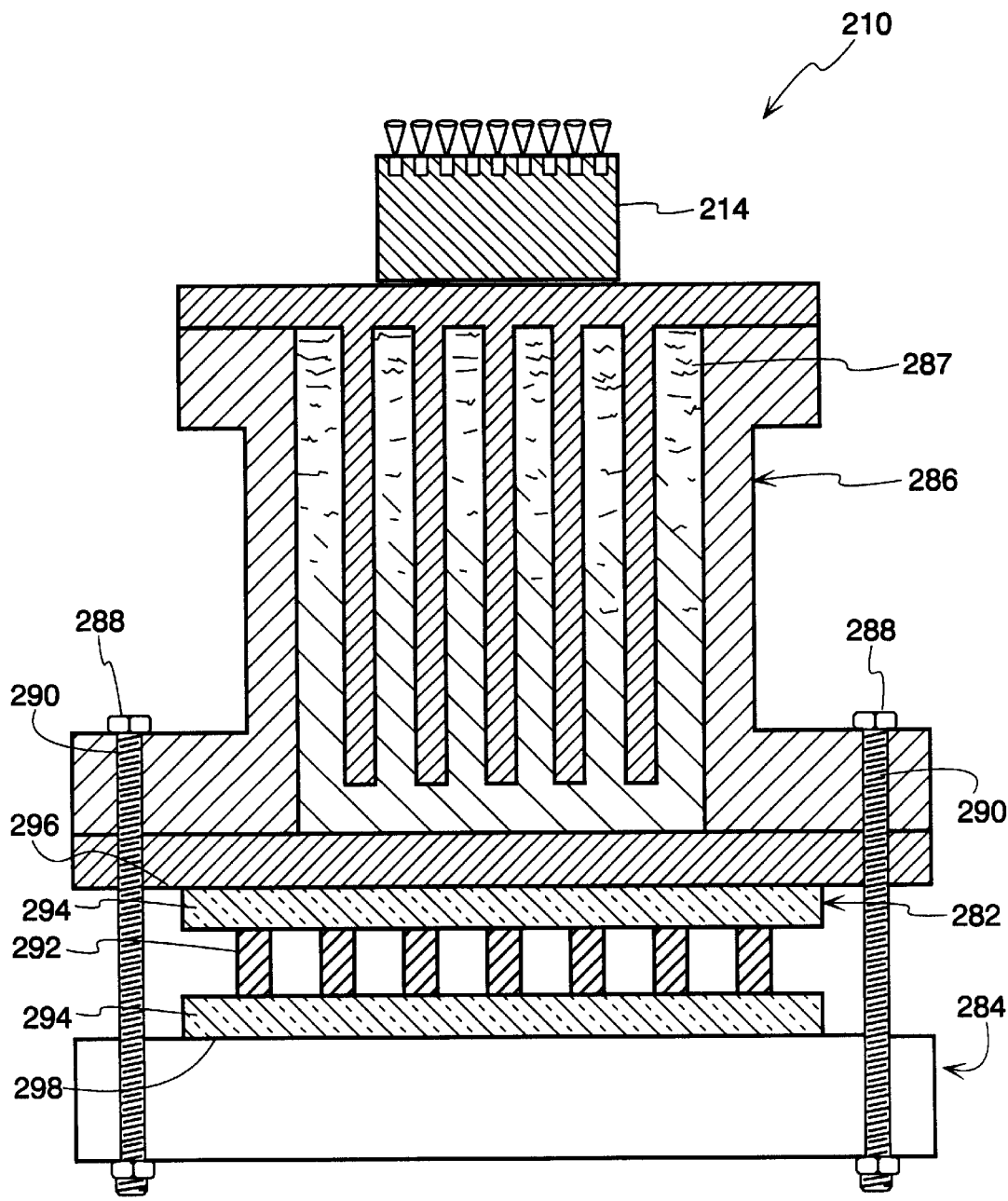
FIG. 14 is cross-sectional view of the laser diode array, heat sink assembly, thermoelectric cooling device, and actively cooled heat exchanger.

Referring now to FIG. 14, there is shown a thermoelectric cooler (TEC) 282 of the type produced by Marlow Industries, Inc. of Dallas, Tex. disposed between an active heat exchanger 284 and heat sink assembly 286 containing PCM 287 in thermal communication with the laser diode array 214. The TEC 282 is mounted to the heat sink assembly 286 and the active heat exchanger 284 by soldering, epoxy, or compression method by the use of fasteners. As shown, the heat sink assembly 286 is firmly secured to the heat exchanger 284 by passing fasteners 288 into apertures 290 to engage the components. Thus, the heat exchanger 284 receives the heat from the heat sink assembly 286 that the thermoelectric cooler 282 pumps from its cool side to its hot side, as well as the waste heat from the thermoelectric cooler 282 itself. The heat exchanger 284 then releases this heat to a working fluid flowing therethrough.

The TEC 282 is a solid state heat pump that operates on the Peltier theory. A typical TEC 282 consists of an array of semiconductor elements 292 that act as two dissimilar conductors that create a temperature difference when a voltage is applied to their free ends. The array of semiconductor elements 292 is soldered between two ceramic plates 294, electrically in series and thermally in parallel. As a current passes through the elements, there is a decrease in temperature at the cold side 296 resulting in the absorption of heat from the environment. The heat is carried through the cooler by electron transport and released on the opposite side 298 as electrons move from a high to low energy state. To cool the TEC 282, the active heat exchanger 284 is disposed adjacent to the "hot side" 298 of the TEC 282 to carry away the discharged heat.

The TEC 282, which is in thermal communication with the heat sink assembly 286, can serve to draw heat from the heat sink assembly 286 and solidify the liquid form of PCM 287 so that the laser diode array assembly 210 can be operated without much delay and overheating. For example, this embodiment is especially useful in situations where the ambient temperature of the laser diode array assembly 210 is greater than the melting temperature of the PCM 287. The TEC 282 cooling the heat sink assembly 286 will solidify the PCM 287 so as to keep the laser component from overheating. Also, with the reversal of the current passing through the TEC 282, the TEC 282 can serve to raise the temperature of the PCM 287 for the thermal control of other system components requiring raised temperatures.

Figure 15:
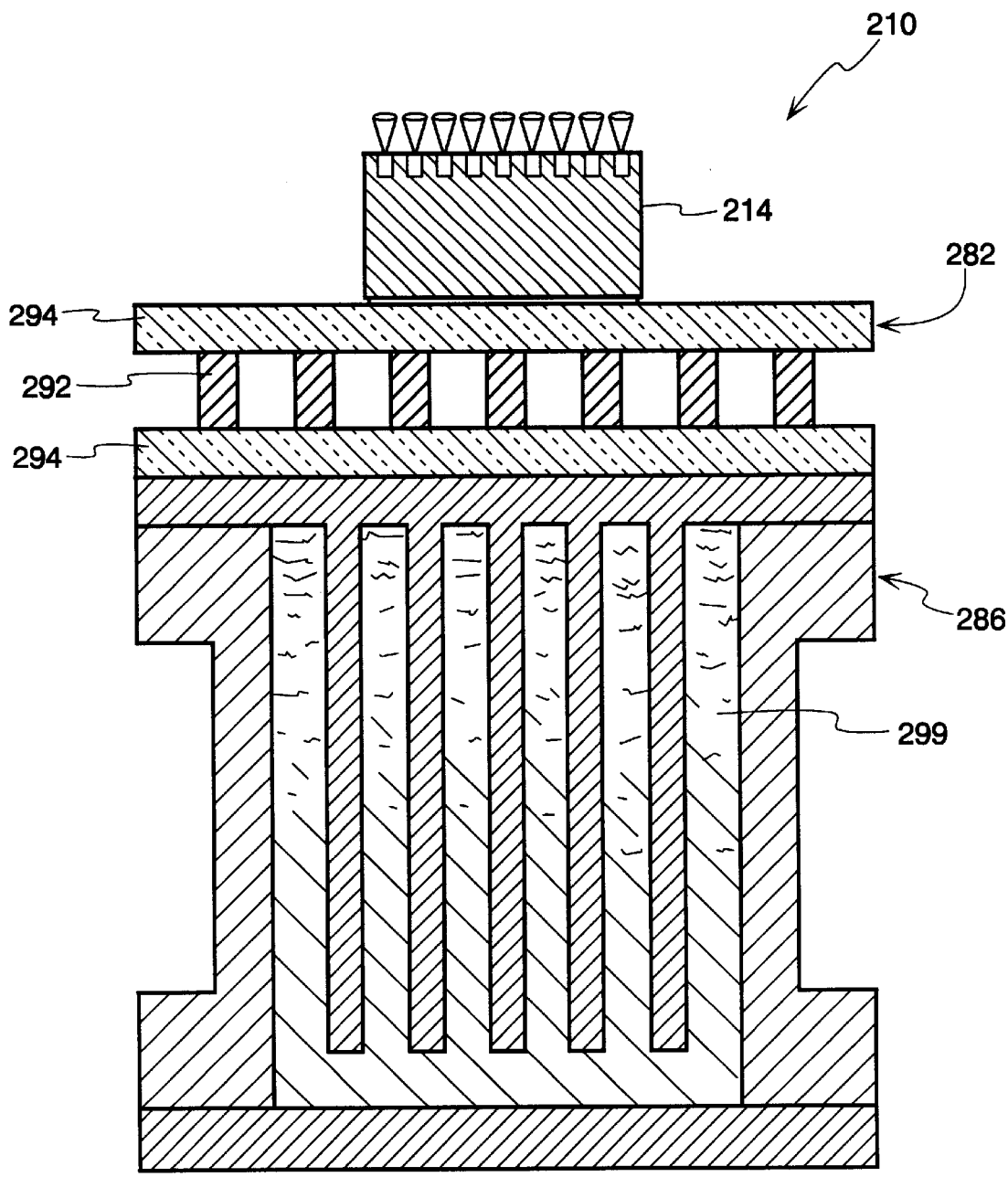
FIG. 15 is a cross-sectional view of the laser diode array, thermoelectric cooling device, and heat sink assembly.

With particular reference now to FIG. 15, there is shown another embodiment of the present invention wherein the TEC 282 is disposed between the laser diode array 214 and a PCM-filled heat sink assembly 286. The TEC 282, which is in thermal communication with the heat sink assembly 286 and laser diode array 214 or other heat-generating system component, is mounted to the laser diode array 214 and heat sink assembly 286 by soldering, epoxy, or compression method by the use of fasteners. In this embodiment, the heat emitted by the laser diode array 214 or other heat-generating component passes through the TEC 282 and is discharged into the PCM-filled heat sink assembly 286. Once the cooling requirements of the system component are defined and the maximum heat load to be transferred by the TEC 282 calculated, the proper PCM 299 with the appropriate phase change temperature can be selected to efficiently operate the system without undue thermal strain on any of the components.

Figure 16:
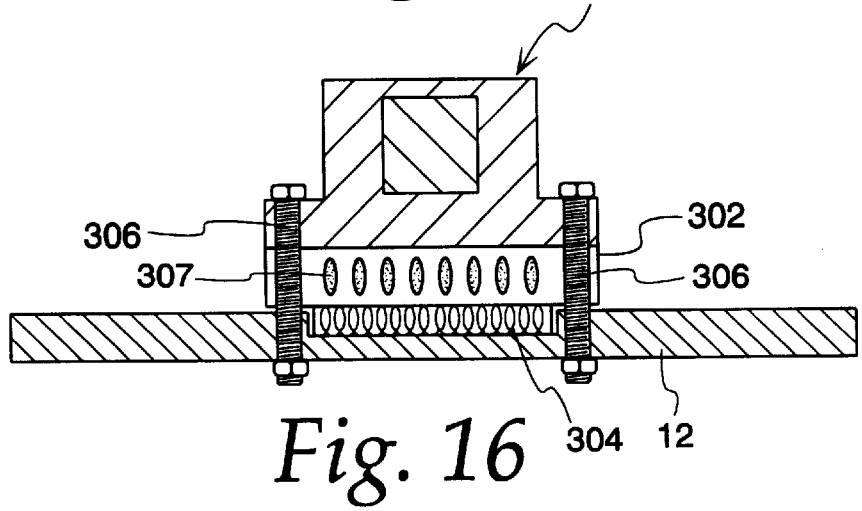
FIG. 16 is a cross-sectional view of a heat-generating component, heat sink assembly, heater, and floor of the optics bench assembly.

As mentioned above, nonlinear optical (NLO) crystal assemblies for the conversion of a first wavelength into a second wavelength typically utilize temperature control systems for the precise control of these temperature-sensitive crystals. An embodiment for the thermal control of NLO crystals 300 such as potassium titanyl phosphate (KTP) and lithium triborate is shown in FIG. 16. A PCM-filled heat sink assembly 302 is disposed between a heater 304 and the NLO crystal 300 which is mounted to the optics bed 12 with fasteners 306. The NLO crystal 300 is maintained at an ideal temperature by the heat transfer from the adjacent heat sink assembly 302 filled with a PCM 307 having a phase change temperature generally coincident with the crystal's ideal temperature (e.g. within 5° C. or less). The heat sink assembly 302 is heated by the heater 304 to keep the PCM 307 in its melt phase so that the NLO crystal 300 in intimate contact with the PCM 307 will be held at a generally constant temperature that coincides with the melting temperature of the PCM 307.

Figure 17:
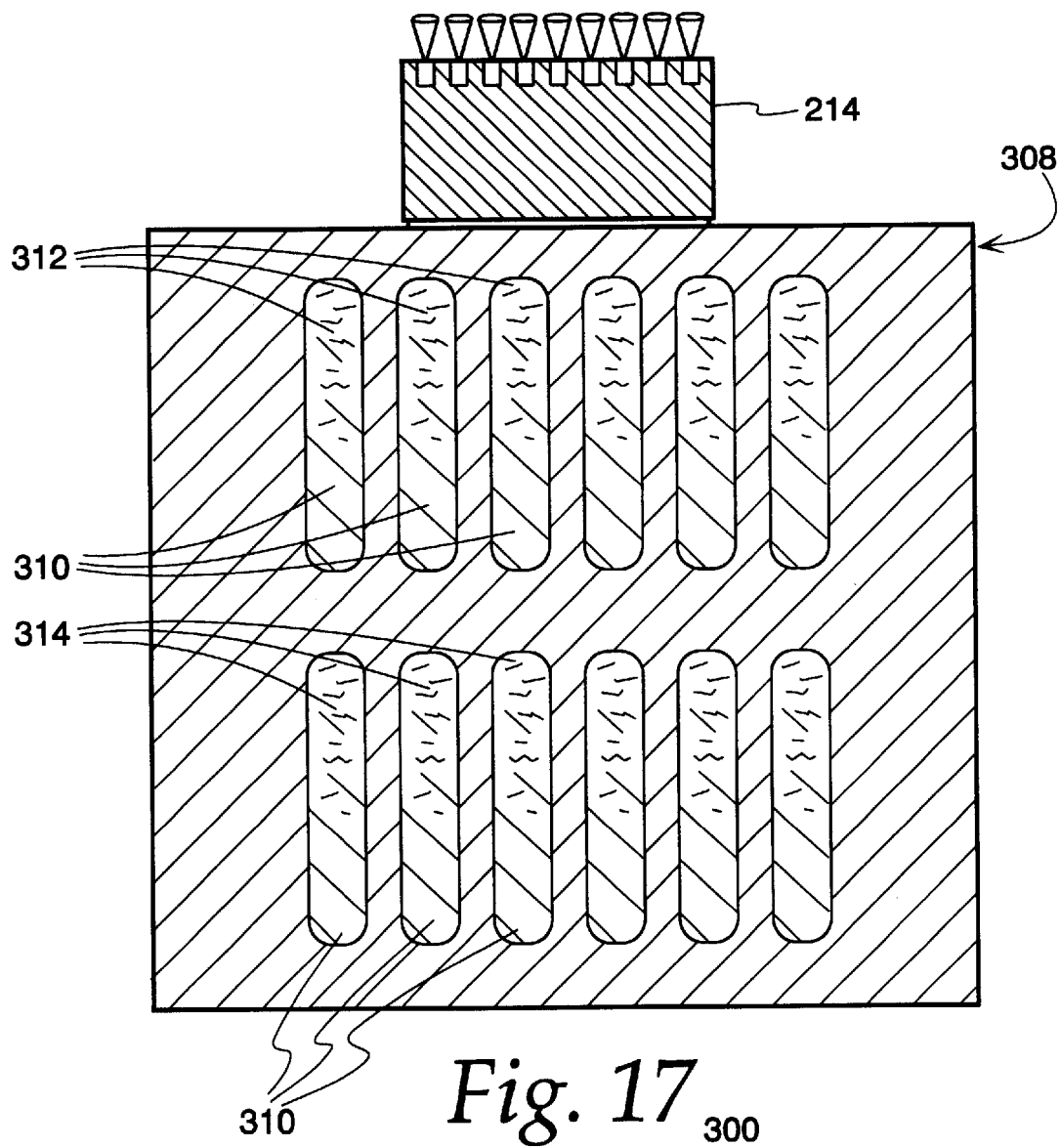
FIG. 17 is a cross-sectional view of the laser diode array and heat sink assembly having multiple types of phase change material.

Referring now to FIG. 17, there is shown a laser diode array 214 in thermal communication with a heat sink assembly 308 having a plurality of cavities 310 filled with two-types of PCM 312, 314 each having two different melting temperatures. Preferably, a PCM 312 having a higher melting temperature is contained in cavities 310 closer to the heat-generating device relative to the cavities 310 filled with a PCM 314 having a lower melting temperature. The PCM-filled cavities 310 proximate to the heat-generating component serve to passively cool it while those further away from the heat-generating component serve as a secondary heat sink for the system. The low-temperature PCM 314 is selected to maintain the high-temperature PCM 312 generally in its melt phase based on the heat load of the laser diode array. While two distinct sets of PCM-filled and EDM-formed cavities 310 are shown in FIG. 17, more than two-types of PCM can be used to tailor the temperature gradient along the length and width of the heat-generating component. Furthermore, EDM and non-EDM cavities of various shapes, sizes, and configurations are also possible. This dual PCM configuration can be used in the heat sinks of the systems described above.

Each of these embodiments and obvious variations thereof is contemplated as falling within the spirit and scope of the invention, which is set forth in the following claims.

What is claimed is:

1. A laser system, comprising:
 a thermal control system for producing passive cooling of a laser temperature-sensitive component that produces heat, said temperature-sensitive component having a desired operating temperature range, said thermal control system comprising;
 a heat sink assembly in thermal communication with said temperature-sensitive component to remove heat therefrom, said heat sink assembly containing a substantially solid form of a phase change material, wherein said removed heat causes said phase change material to change from said solid form to a liquid form at a predetermined phase change temperature; and
 a heat exchanger in thermal communication with said heat sink assembly to remove heat from said heat sink assembly so as to maintain said phase change material at about said phase change temperature, said heat exchanger transferring heat from said heat sink assembly to a working fluid in thermal communication with said heat exchanger to thereby maintain said temperature-sensitive component within said desired operating temperature range and thereby enhance the performance of said temperature-sensitive component.

2. The laser system of claim 1, wherein said phase change material is one material selected from the group consisting of gallium, alkyl hydrocarbons, salt hydrates, and low temperature metallic alloys.

3. The laser system of claim 1, wherein said laser temperature-sensitive component is one of the components consisting of an acousto-optic q-switch, a nonlinear crystal, a beam dump, a laser diode array, and a laser medium.

4. The laser system of claim 1, wherein said heat exchanger is directly attached to said heat sink assembly.

5. The laser system of claim 1, wherein said heat sink assembly includes fins having upper and lower portions and defining gaps therebetween, said phase change material being placed in said gaps adjacent to said upper portion, said lower portion of said fins being a part of said heat exchanger.

6. The laser system of claim 1, wherein said phase change material is gallium and said working fluid is maintained below about 30° C.

7. The laser system of claim 1, wherein said temperature-sensitive component has an operating temperature, said phase change temperature being approximately equal to a desired operating temperature.

8. The laser system of claim 1, wherein said temperature-sensitive component has an operating temperature, said phase change temperature being within about 5° C. of a desired operating temperature.

9. The laser system of claim 1, wherein said heat exchanger is integrally formed with said heat sink assembly.

10. The laser system of claim 9, wherein said heat exchanger has fins which are interposed with fins of said heat sink assembly.

11. The laser system of claim 1, wherein said heat sink assembly defines a plurality of phase-change-material cavities for receiving said phase change material, said heat exchanger defines a plurality of working fluid cavities for receiving said working fluid.

12. The laser system of claim 11, wherein said phase-change-material cavities are proximately located to said temperature-sensitive component relative to said working fluid cavities.

13. The laser system of claim 11, wherein said phase-change-material cavities are interposed with said working fluid cavities.

14. The laser system of claim 1, further including a fluid circuit, connected to said heat exchanger, said fluid circuit providing movement to said working fluid for forced convection heat transfer.

15. The laser system of claim 1, wherein said heat exchanger is capable of receiving heat from said working fluid and transfers heat to said heat sink assembly in thermal communication with said heat exchanger.

16. The laser system of claim 1, wherein said heat sink assembly includes a base plate with a plurality of surfaces extending from said base plate and forming interstices therebetween, said phase change material being in contact with said extended surfaces, said plurality of surfaces extending radially from said base plate.

17. The laser system of claim 1, wherein said working fluid is air.

18. The laser system of claim 1, wherein said heat exchanger continues to remove heat from said heat sink assembly after operation of said temperature-sensitive component to cause phase change material to return to said solid form.

19. A laser system, comprising:
    a thermal control system for producing passive cooling of a laser temperature-sensitive component that produces heat, said temperature-sensitive component having a desired operating temperature range, said thermal control system comprising;
    a heat sink assembly in thermal communication with said temperature-sensitive component to remove said heat therefrom, said heat sink assembly containing a substantially solid form of a phase change material, and wherein said removed heat causes said phase change material to change from said solid form to a liquid form at a predetermined phase change temperature; and
    a heat exchanger in thermal communication with said heat sink assembly, said heat exchanger transferring heat from said heat sink assembly to air that is in thermal communication with said heat exchanger for maintaining said phase change material at about said phase change temperature and thereby to enhance the performance of said temperature-sensitive component by maintaining said temperature-sensitive component within said desired operating temperature range.

20. The laser system of claim 19, wherein said air is forced through said heat exchanger.

21. The laser system of claim 19, wherein said air is passing through said heat exchanger via natural convection.

22. The laser system of claim 19, wherein said heat exchanger continues to remove heat from said heat sink assembly after operation of said temperature-sensitive component to cause said phase change material to return to said solid form.

\* \* \* \* \*